(12) United States Patent  
Onuki et al.

(10) Patent No.: US 11,476,862 B2
(45) Date of Patent: Oct. 18, 2022

(54) SEMICONDUCTOR DEVICE INCLUDING SIGNAL HOLDING CIRCUIT

(71) Applicant: SEMICONDUCTOR ENERGY LABORATORY CO., LTD., Atsugi (JP)

(72) Inventors: Tatsuya Onuki, Kanagawa (JP); Yuto Yakubo, Kanagawa (JP); Kiyoshi Kato, Kanagawa (JP); Seiya Saito, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/282,098

(22) PCT Filed: Oct. 10, 2019

(86) PCT No.: PCT/IB2019/058629
§ 371 (c)(1),
(2) Date: Apr. 1, 2021

(87) PCT Pub. No.: WO2020/079539
PCT Pub. Date: Apr. 23, 2020

(65) Prior Publication Data
US 2021/0376848 A1 Dec. 2, 2021

(30) Foreign Application Priority Data
Oct. 18, 2018 (JP) .............................. JP2018-196349

(51) Int. Cl.
H03M 1/00 (2006.01)
H03M 1/12 (2006.01)
(Continued)

(52) U.S. Cl.
CPC .......... H03M 1/1245 (2013.01); G01D 21/00 (2013.01); G11C 27/02 (2013.01)

(58) Field of Classification Search
CPC .............................. H03M 1/1245; G11C 27/02
(Continued)

(56) References Cited

U.S. PATENT DOCUMENTS 4,677,422 A 6/1987 Naito
7,456,763 B2 11/2008 Hirose et al.
(Continued)

FOREIGN PATENT DOCUMENTS

EP 0147117 A 7/1985
JP 54-072059 5/1979
(Continued)

OTHER PUBLICATIONS

International Search Report (Application No. PCT/IB2019/058629) dated Dec. 10, 2019.
(Continued)

Primary Examiner — Peguy Jean Pierre
(74) Attorney, Agent, or Firm — Fish & Richardson P.C.

(57) ABSTRACT

A semiconductor device with a novel structure is provided. The semiconductor device includes a sensor, an amplifier circuit to which a sensor signal of the sensor is input, a sample-and-hold circuit that retains a voltage corresponding to an output signal of an amplifier input to the sample-and-hold circuit, an analog-to-digital converter circuit to which an output signal of the sample-and-hold circuit corresponding to the voltage is input, and an interface circuit. The interface circuit has a function of switching and controlling a first control period in which the sensor signal is input to the amplifier circuit and an output signal of the amplifier circuit is retained in the sample-and-hold circuit and a second control period in which a digital signal obtained by output of the voltage retained in the sample-and-hold circuit to the analog-to-digital converter circuit is output to the interface circuit. In the first control period, the analog-to-digital
(Continued)

converter circuit is switched to stop output of the digital signal. The first control period is longer than the second control period.

10 Claims, 21 Drawing Sheets

(51) Int. Cl.
*G01D 21/00* (2006.01)
*G11C 27/02* (2006.01)

(58) Field of Classification Search
USPC .................................................. 341/122, 155
See application file for complete search history.

(56) References Cited

U.S. PATENT DOCUMENTS

| | | | |
|---|---|---|---|
| 7,659,892 B2 | 2/2010 | Tanada et al. | |
| 7,952,323 B2 | 5/2011 | Lamothe | |
| 8,315,682 B2* | 11/2012 | Such | A61B 5/6826 600/323 |
| 9,859,905 B2 | 1/2018 | Shionoiri et al. | |
| 10,193,563 B2 | 1/2019 | Shionoiri et al. | |
| 2001/0019516 A1 | 9/2001 | Wake et al. | |
| 2007/0164890 A1 | 7/2007 | Hirose et al. | |
| 2012/0057396 A1 | 3/2012 | Yamazaki et al. | |
| 2014/0138432 A1 | 5/2014 | Park et al. | |
| 2015/0255157 A1 | 9/2015 | Ikeda et al. | |
| 2016/0094236 A1 | 3/2016 | Shionoiri et al. | |
| 2016/0117584 A1 | 4/2016 | Yoneda et al. | |
| 2017/0235325 A1* | 8/2017 | Onoya | H01L 23/645 323/313 |
| 2018/0003819 A1* | 1/2018 | Koptenko | G01N 29/0672 |
| 2019/0348011 A1 | 11/2019 | Kurokawa | |
| 2020/0112320 A1 | 4/2020 | Ikeda et al. | |
| 2020/0228912 A1 | 7/2020 | Mate et al. | |
| 2020/0260034 A1* | 8/2020 | Moue | H01L 27/14603 |
| 2021/0297775 A1 | 9/2021 | Ikeda et al. | |

FOREIGN PATENT DOCUMENTS

| | | |
|---|---|---|
| JP | 58-062927 A | 4/1983 |
| JP | 60-124125 A | 7/1985 |
| JP | 07-086939 A | 3/1995 |
| JP | 2007-194877 A | 8/2007 |
| JP | 2010-245664 A | 10/2010 |
| JP | 2015-092662 A | 5/2015 |
| JP | 2016-111677 A | 6/2016 |
| KR | 2016-0037085 A | 4/2016 |

OTHER PUBLICATIONS

Written Opinion (Application No. PCT/IB2019/058629) dated Dec. 10, 2019.

* cited by examiner

SEMICONDUCTOR DEVICE INCLUDING SIGNAL HOLDING CIRCUIT

CROSS REFERENCE TO RELATED APPLICATIONS

This application is a U.S. National Phase Application under 35 U.S.C. § 371 of International Application PCT/IB2019/058629, filed on Oct. 10, 2019, which is incorporated by reference and claims the benefit of a foreign priority application filed in Japan on Oct. 18, 2018, as Application No. 2018-196349.

TECHNICAL FIELD

One embodiment of the present invention relates to a semiconductor device.

Note that in this specification and the like, a semiconductor device generally means a device that can function by utilizing semiconductor characteristics. In some cases, it can be said that a display device (a liquid crystal display device, a light-emitting display device, or the like), a projection device, a lighting device, an electro-optical device, a power storage device, a memory device, a semiconductor circuit, an imaging device, a signal processing device, a transmission/reception device, a wireless sensor, a sensor device, or the like includes a semiconductor device.

BACKGROUND ART

Research and development for reducing the power consumption of a semiconductor device have been progressed. For example, a semiconductor device that functions as a sensor-equipped signal processing device which includes a sensor, an amplifier circuit, a sample-and-hold circuit, and an analog-digital converter circuit (Analog to digital: hereinafter an A/D converter circuit) including a comparator and the like, has been proposed in Patent Document 1.

Patent Document 1 discloses a semiconductor device with a structure in which a momentary increase in power consumption is inhibited by separating the operation period of the sample-and-hold circuit from that of the comparator in a period during which power is supplied by a radio signal.

PRIOR ART DOCUMENT

Patent Document

[Patent Document 1] United States Patent Application Publication No. 2016/0094236

SUMMARY OF THE INVENTION

Problems to be Solved by the Invention

The percentage of the consumption current of an A/D converter circuit is high in the consumption current of a semiconductor device. Intermittent operation of the A/D converter circuit is effective in reducing the power consumption of the semiconductor device. However, analog signals output from a sensor are sampled in every fixed period; thus, it has been difficult to set the A/D converter circuit in a non-operation period for a long period.

In a semiconductor device that functions as a sensor-equipped signal processing device, a structure that calculates an average of values sampled more than once is effective in increasing the accuracy of a value obtained as an analog signal. However, an A/D converter circuit needs to operate for every multiple sampling; thus, it has been difficult to set the A/D converter circuit in a non-operation period for a long time.

An object of one embodiment of the present invention is to provide a semiconductor device having a novel structure and functioning as a sensor-equipped signal processing device for achieving low power consumption. An object of one embodiment of the present invention is to provide a semiconductor device having a novel structure allowing prolonged driving and functioning as a sensor-equipped signal processing device. Another object of one embodiment of the present invention is to provide a semiconductor device with a novel structure that can retain a sensor signal as an analog voltage even under an environment where ambient temperature changes significantly. An object of one embodiment of the present invention is to provide a semiconductor device having a novel structure allowing low power consumption and highly accurate sampling and functioning as a sensor-equipped signal processing device. Another object of one embodiment of the present invention is to provide a novel semiconductor device and the like.

Note that the description of these objects does not preclude the existence of other objects. Note that one embodiment of the present invention does not have to achieve all these objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention is a semiconductor device that includes a sensor, an amplifier circuit to which a sensor signal of the sensor is input, a sample-and-hold circuit that retains a voltage corresponding to an output signal of the amplifier circuit input to the sample-and-hold circuit, an analog-to-digital converter circuit to which an output signal of the sample-and-hold circuit corresponding to the voltage is input, and an interface circuit. The interface circuit has a function of switching and controlling a first control period in which the sensor signal is input to the amplifier circuit and the output signal of the amplifier circuit is retained in the sample-and-hold circuit and a second control period in which a digital signal obtained by output of the voltage retained in the sample-and-hold circuit to the analog-to-digital converter circuit is output to the interface circuit. In the first control period, the analog-to-digital converter circuit is switched to stop output of the digital signal. The first control period is longer than the second control period.

One embodiment of the present invention is a semiconductor device that includes a sensor, an amplifier circuit to which a sensor signal of the sensor is input, a sample-and-hold circuit that retains a voltage corresponding to an output signal of the amplifier circuit input to the sample-and-hold circuit, an analog-to-digital converter circuit to which an output signal of the sample-and-hold circuit corresponding to the voltage is input, and an interface circuit. The interface circuit has a function of switching and controlling a first control period in which the sensor signal is input to the amplifier circuit and the output signal of the amplifier circuit is retained in the sample-and-hold circuit and a second control period in which a digital signal obtained by output of the voltage retained in the sample-and-hold circuit to the analog-to-digital converter circuit is output to the interface circuit. In the first control period, the analog-to-digital converter circuit is switched to stop output of the digital signal. The sample-and-hold circuit has a function of retaining a voltage obtained by addition of a plurality of output signals of an amplifier. The first control period is longer than the second control period.

In one embodiment of the present invention, in the semiconductor device, it is preferable that the sample-and-hold circuit include a plurality of capacitors whose one electrodes are electrically connected, and the plurality of output signals of the amplifier are added in the sample-and-hold circuit by inputting any one of the plurality of output signals of the amplifier to any one of the other electrodes of the capacitors with the one electrodes of the capacitors brought into electrically floating.

In one embodiment of the present invention, in the semiconductor device, it is preferable that the sample-and-hold circuit include a first transistor, a second transistor, and a third transistor, and the first transistor to the third transistor each include a semiconductor layer including an oxide semiconductor in a channel formation region.

In one embodiment of the present invention, it is preferable that a gate of the second transistor be electrically connected to one of a source and a drain of the first transistor, and the semiconductor device have a function of retaining a voltage corresponding to the output signal of the amplifier by turning off the first transistor.

In one embodiment of the present invention, it is preferable that the second transistor and the third transistor function as a source-follower circuit in the semiconductor device.

Note that other embodiments of the present invention are shown in the description of the following embodiments and the drawings.

Effect of the Invention

One embodiment of the present invention can provide a semiconductor device having a novel structure and functioning as a sensor-equipped signal processing device for achieving low power consumption. One embodiment of the present invention can provide a semiconductor device having a novel structure allowing prolonged driving and functioning as a sensor-equipped signal processing device. Another object of one embodiment of the present invention can provide a semiconductor device with a novel structure that can retain a sensor signal as an analog voltage even under an environment where ambient temperature changes significantly. One embodiment of the present invention can provide a semiconductor device having a novel structure allowing low power consumption and highly accurate sampling and functioning as a sensor-equipped signal processing device. Another object of one embodiment of the present invention can provide a novel semiconductor device and the like.

Note that the description of these effects does not disturb the existence of other effects. Note that one embodiment of the present invention does not need to have all these effects. Note that effects other than these will be apparent from the description of the specification, the drawings, the claims, and the like, and effects other than these can be derived from the description of the specification, the drawings, the claims, and the like.

MODE FOR CARRYING OUT THE INVENTION

Figure 1A:
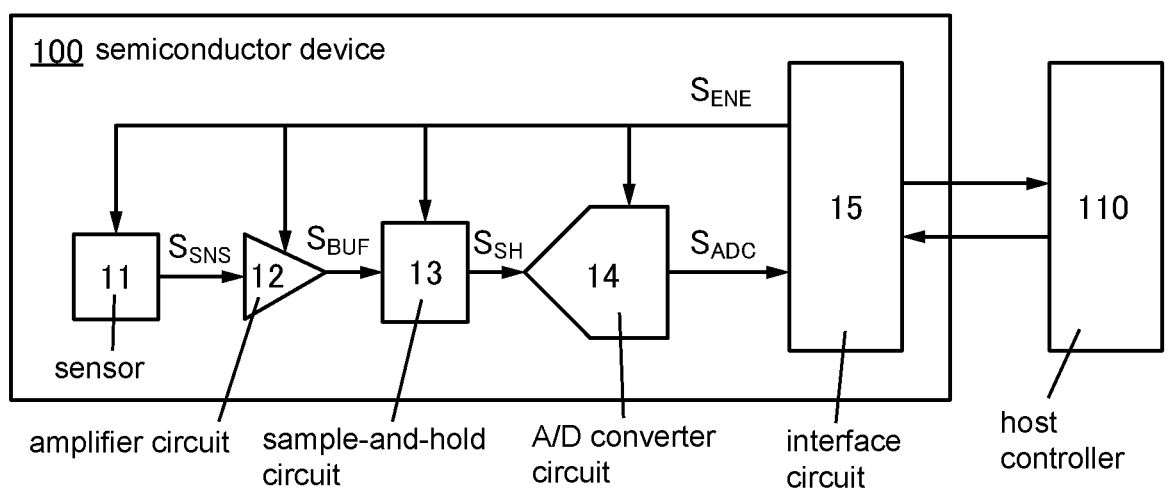
FIG. 1A and FIG. 1B are a block diagram and a circuit diagram showing a structure of a semiconductor device.

Embodiments will be described below with reference to the drawings. Note that the embodiments can be implemented with many different modes, and it will be readily understood by those skilled in the art that modes and details thereof can be changed in various ways without departing from the spirit and scope thereof Therefore, the present invention should not be construed as being limited to the description of embodiments below.

Note that ordinal numbers such as "first," "second," and "third" in this specification and the like are used in order to avoid confusion among components. Thus, the ordinal numbers do not limit the number of components. In addition, the ordinal numbers do not limit the order of components. Furthermore, in this specification and the like, for example, a "first" component in one embodiment can be referred to as a "second" component in other embodiments or claims. Moreover, in this specification and the like, for example, a "first" component in one embodiment can be omitted in other embodiments or claims.

Note that in the drawings, the same elements, elements having similar functions, elements formed of the same material, elements formed at the same time, or the like are sometimes denoted by the same reference numerals, and repeated description thereof is omitted in some cases.

Embodiment 1

The structures and operation of semiconductor devices according to one embodiment of the present invention will be described using FIG. 1 to FIG. 11.

A semiconductor device according to one embodiment of the present invention includes an interface circuit, an amplifier circuit, a sample-and-hold circuit, an A/D converter circuit, and a sensor. The semiconductor device is equipped with a battery and is driven by power supplied from the battery. The semiconductor device includes a wireless or wired communication circuit for an RF (Radio Freqency) signal or the like and has a function of transmitting signals obtained by the sensor in response to request from the outside. In the semiconductor device, a circuit with high power consumption, such as the A/D converter circuit, is driven intermittently as its operation, and the power from the battery is allocated to driving of the sensor and the sample-and-hold circuit. In a period during which driving of the A/D converter circuit is stopped, the sample-and-hold circuit periodically obtains signals obtained by the sensor using the power from the battery and retains the signals as analog voltages. In addition, the signals are retained in the sample-and-hold circuit formed using a transistor (OS transistor) in which a channel formation region includes an oxide semiconductor (OS).

The OS transistor has an extremely low off-state current and has a small variation in characteristics due to temperature as compared to a transistor including silicon in a semiconductor layer (a Si transistor); therefore, sensor signals obtained by periodic sensing can be retained as analog voltages even under an environment with a large change in environmental temperature.

The A/D converter circuit for generating digital signals has high power consumption. Thus, the A/D converter circuit is driven intermittently as its operation so that the power consumption of the semiconductor device is suppressed. In the period during which driving of the A/D converter circuit is stopped, the sensor and the sample-and-hold circuit are driven. Even in the period during which driving of the A/D converter circuit is stopped, the sample-and-hold circuit periodically samples signals obtained by the sensor. A structure is employed in which a plurality of analog voltage signals obtained by sampling are subjected to A/D conversion at a time and are output to external upper-level equipment at the timing of driving the A/D converter circuit.

A structure that switches the sensor-signal sampling operation with the A/D converter circuit stopped and the A/D conversion operation on the retained analog voltage with the A/D converter circuit operated can achieve both acquisition of sensing data in every fixed period and a reduction in power consumption. When driving of the A/D converter circuit is minimized, the semiconductor device can achieve prolonged driving with the power from the battery.

FIG. 1A illustrates a semiconductor device 100 for describing one embodiment of the present invention. The semiconductor device 100 includes a sensor 11, an amplifier circuit 12, a sample-and-hold circuit 13, an A/D converter circuit 14, and an interface circuit 15, for example. The semiconductor device 100 has a function of transmitting and receiving signals to and from a host controller 110. In addition, although not illustrated, the semiconductor device 100 includes a battery or the like for supplying power to each circuit in the semiconductor device 100.

The sensor 11 has a function of converting an input signal such as light, sound, distortion, acceleration, pressure, humidity, an electric field, a magnetic field, or the amount of chemical substances, into an output signal that is an electrical signal. The output signal that is an electrical signal can be obtained as a signal $S_{SNS}$ having a voltage with an analog value (an analog voltage). As the sensor 11, a variety of sensors that monitor the environment (an optical sensor, a thermal sensor, a humidity sensor, a gas sensor, an odor sensor, a vibration sensor, an acceleration sensor, a distortion sensor, or the like), a variety of biological sensors, or the like can be used. A sensor-equipped semiconductor device as illustrated in FIG. 1A can transmit a result of measurement by a chip embedded in a building or a human body in every fixed period through wireless communication. Thus, one or more sensors are preferably employed as the sensor 11 according to the purpose.

The amplifier circuit 12 is a circuit for amplifying the current or voltage of a signal obtained by the sensor 11. The amplifier circuit 12 has a function of outputting the input signal $S_{SNS}$ as a signal $S_{BUF}$. The signal $S_{BUF}$ corresponds to the signal $S_{SNS}$ whose current or voltage is amplified. The amplifier circuit 12 can be formed using an operational amplifier, a buffer, or the like.

The sample-and-hold circuit 13 has functions of retaining an analog voltage corresponding to the signal $S_{BUF}$ output from the amplifier circuit 12 and outputting a signal $S_{SH}$ with a voltage corresponding to the analog voltage. A switch included in the sample-and-hold circuit 13 is turned on at predetermined time to sample the signal $S_{BUF}$, so that an analog voltage corresponding to the signal $S_{SNS}$ output from the sensor 11 is written to the sample-and-hold circuit 13 at predetermined time.

The A/D converter circuit 14 is a circuit for converting the signal $S_{SH}$ output from the sample-and-hold circuit 13 into a signal $S_{ADC}$ with a digital value. The A/D converter circuit 14 is freely selected from, for example, a parallel-comparison-type A/D converter circuit, a pipeline-type A/D converter circuit, a successive-comparison-type A/D converter circuit, a delta-sigma-type A/D converter circuit, and a double-integrating-type A/D converter circuit.

The interface circuit 15 has a function of transmitting and receiving a signal to and from the host controller 110 corresponding to the above external equipment. The interface circuit 15 has a function of generating a signal to be transmitted to the host controller 110 on the basis of the signal $S_{ADC}$ output from the A/D converter circuit 14. Signals are preferably transmitted and received through wireless communication. The interface circuit 15 preferably includes an antenna and a transmission/reception circuit as a structure for wireless communication. The transmission/reception circuit includes, for example, a rectifier circuit, a modulation circuit, a demodulation circuit, an oscillator circuit, a constant-voltage circuit (regulator), and the like. A structure can be employed in which the chip is embedded in the building or the human body, the sensor performs measurement in every fixed period, and the host controller 110 collects information obtained through wireless communication.

The interface circuit 15 has a function of outputting signals $S_{ENE}$ for controlling the sensor 11, the amplifier circuit 12, the sample-and-hold circuit 13, and the A/D converter circuit 14 in response to a signal received from the host controller 110. The signals $S_{ENE}$ correspond to a signal for controlling driving or driving stopping of the A/D converter circuit 14, a signal for controlling driving of the sample-and-hold circuit 13, and a signal for controlling driving or driving stopping of the sensor 11 and the amplifier circuit 12.

Figure 1B:
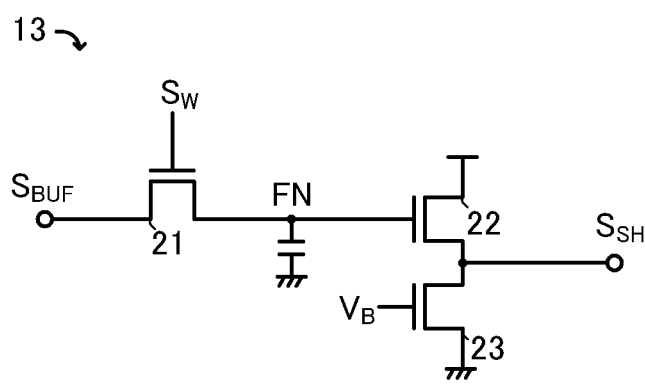

FIG. 1B illustrates the structure of the sample-and-hold circuit 13. The sample-and-hold circuit 13 includes transistors 21 to 23. The transistors 21 to 23 are n-channel transistors. A signal $S_W$ is a signal for controlling the on or off of the transistor 21 to sample the signal $S_{BUF}$ at predetermined timing.

Note that description is made using the reference numeral "sample-and-hold circuit 13" when there is no need to identify one sample-and-hold circuit 13, and description is made using a reference numeral such as "sample-and-hold circuit 13_1" or "sample-and-hold circuit 13_2" when a given sample-and-hold circuit 13 is identified. The same applies to other elements, and reference numerals to which "_2," "[1]," and the like are added are used to distinguish a plurality of elements from each other.

FIG. 1B illustrates a node FN that retains a sampled analog voltage. FIG. 1B also illustrates a structure where the node FN is connected to a gate of the transistor 22 that is an input terminal of a source-follower circuit. FIG. 1B also illustrates a structure where a bias voltage $V_B$ of the source-follower circuit is applied to a gate of the transistor 23. Note that although a structure where a capacitor is connected to the node FN is illustrated, the capacitor can be omitted when the gate capacitance of the transistor 22 is sufficiently large, for example. The source-follower circuit can increase the capability to supply electric charge to a circuit in a subsequent stage. Moreover, the OS transistor has a small variation in transistor electrical characteristics against a change in the environmental temperature. Therefore, when the source-follower circuit is formed using the OS transistor, a leakage current that flows under an environment where ambient temperature changes significantly can be reduced.

The transistors 21 to 23 are OS transistors. With the use of OS transistors as the transistors included in the sample-and-hold circuit 13, an analog voltage obtained by sampling of the signal $S_{BUF}$ can be retained in the node FN thanks to an extremely low leakage current (hereinafter off-state current) flowing between sources and drains at the time when the transistors are off. Therefore, even with a structure where the analog voltage is retained as it is without immediate A/D conversion after acquisition of the analog voltage and is then read, a highly accurate output signal can be obtained, and the power consumption of the semiconductor device 100 can be reduced.

In addition, the sample-and-hold circuit 13 using OS transistors can rewrite and read the analog voltage by charging or discharging electric charge; thus, a substantially unlimited number of times of acquisition and reading of the analog voltage is possible. Unlike a magnetic memory, a resistive random access memory, or the like, a signal holding circuit using OS transistors has no change in the structure at the atomic level and thus exhibits high rewrite endurance. Furthermore, unlike a flash memory, the signal holding circuit using OS transistors does not show instability due to an increase of electron trap centers even when rewrite operations are repeated.

In addition, the signal holding circuit using OS transistors can be freely placed, for example, over a circuit using a Si transistor and thus integration can be facilitated even when a plurality of delay circuits are provided. Furthermore, OS transistors can be manufactured using a manufacturing apparatus similar to that for Si transistors and thus can be manufactured at low cost.

In addition, when an OS transistor has a back gate electrode in addition to a gate electrode, a source electrode, and a drain electrode, the OS transistor can be a four-terminal semiconductor element. The OS transistor can be formed using an electric circuit network that can independently control input and output of signals flowing between a source and a drain depending on a voltage applied to the gate electrode or the back gate electrode. Therefore, it is possible to design circuits under the same thought as LSI. Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

Figure 2A:
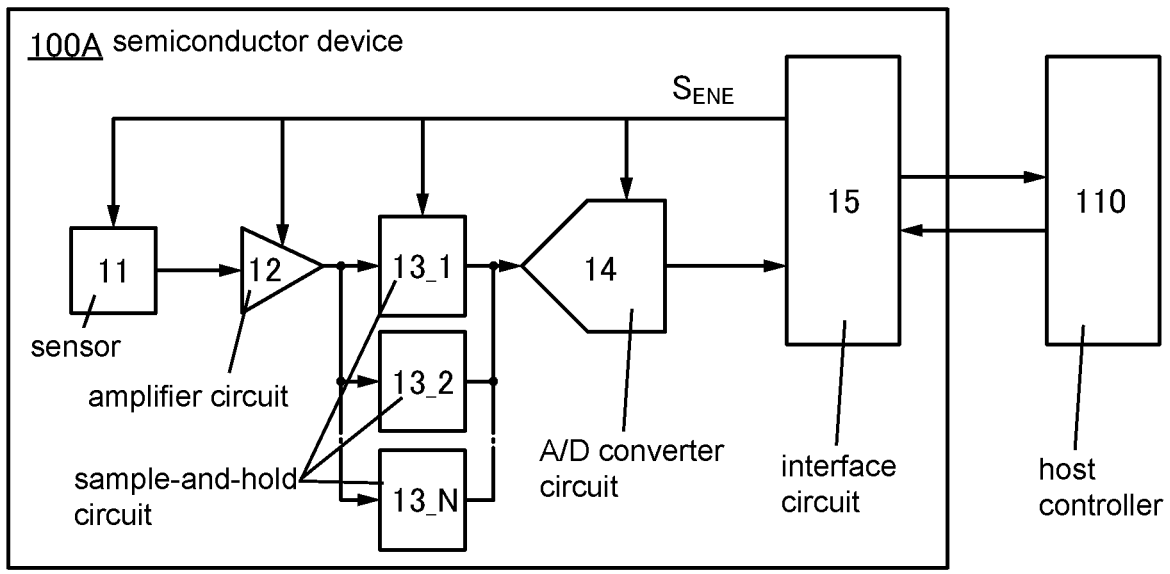
FIG. 2A and FIG. 2B are block diagrams each showing a structure of a semiconductor device.
Figure 2B:
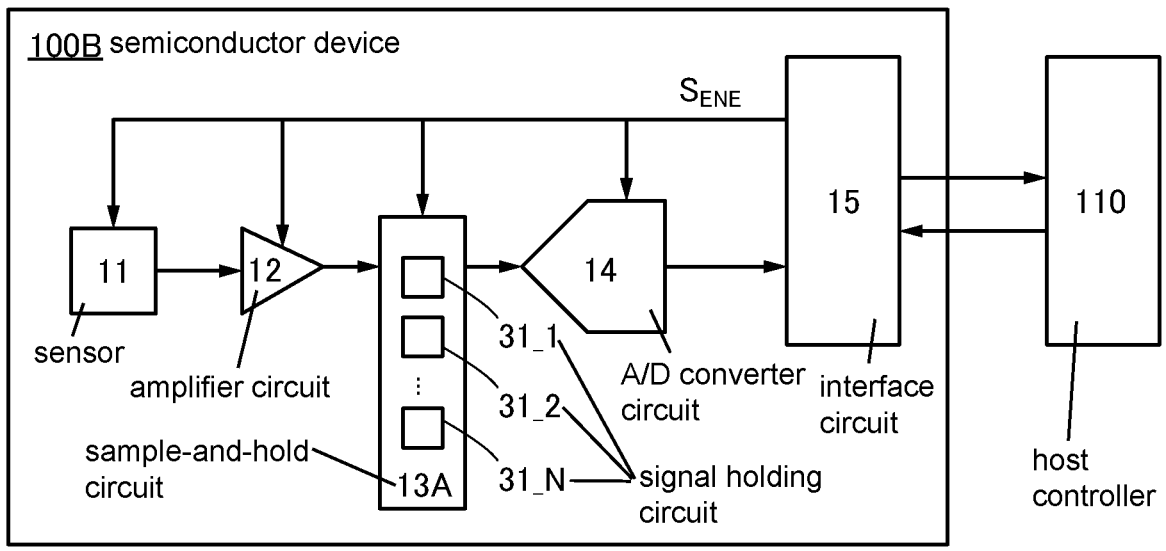

Note that FIG. 1B illustrates a circuit configuration where one node FN for retaining an analog voltage is provided for the sample-and-hold circuit 13; however, a plurality of sample-and-hold circuits 13_1 to 13_N (N is a natural number of two or more) can be represented, as illustrated in a semiconductor device 100A in FIG. 2A. Alternatively, a plurality of signal holding circuits 31_1 to 31_N can be represented in a sample-and-hold circuit 13A, as illustrated in a semiconductor device 100B in FIG. 2B.

Figure 3A:
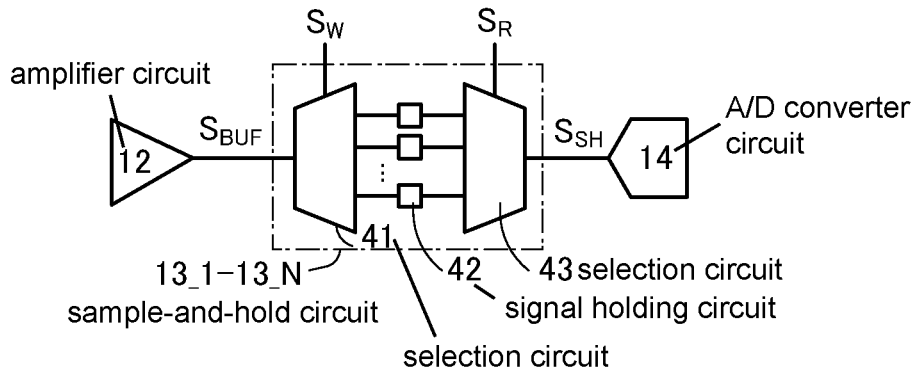
FIG. 3A and FIG. 3B are a block diagram and a circuit diagram showing a structure of a semiconductor device.
Figure 3B:
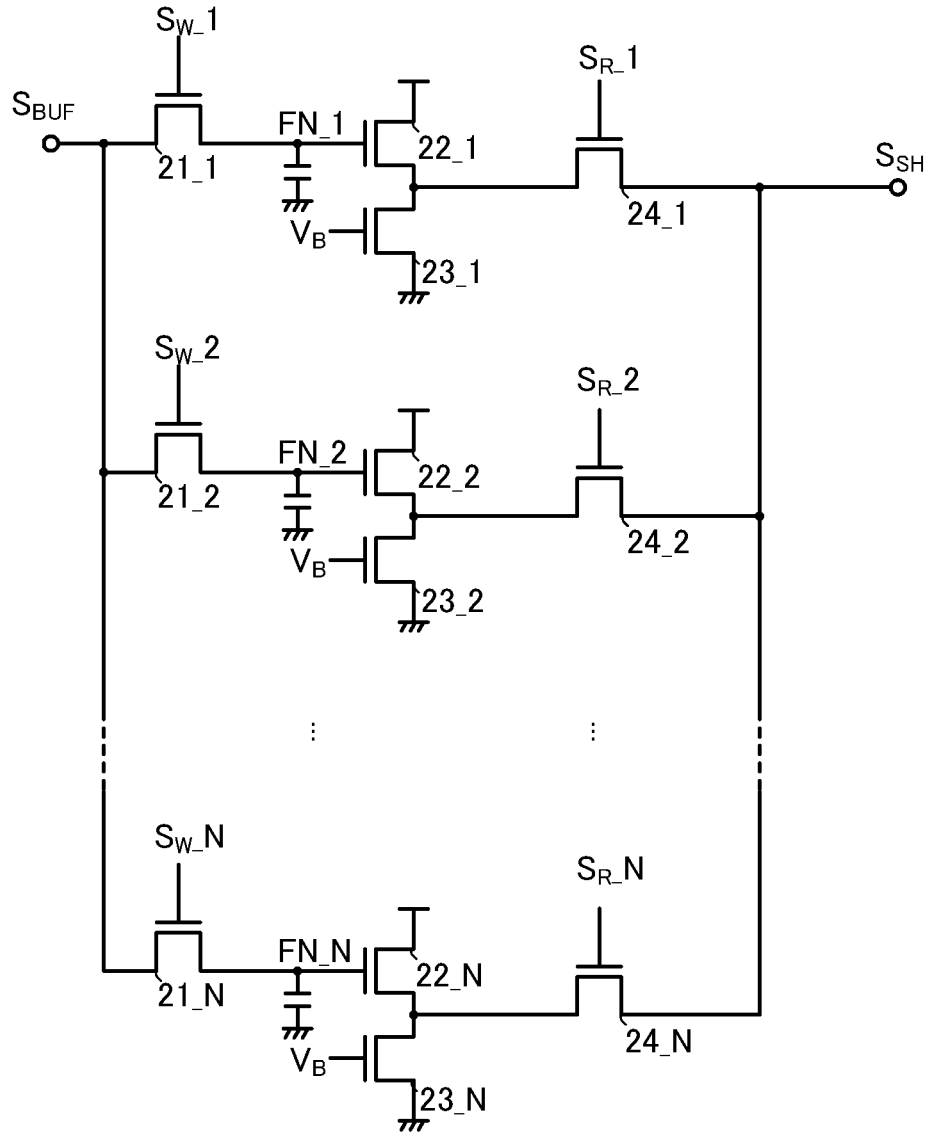
Figure 4:
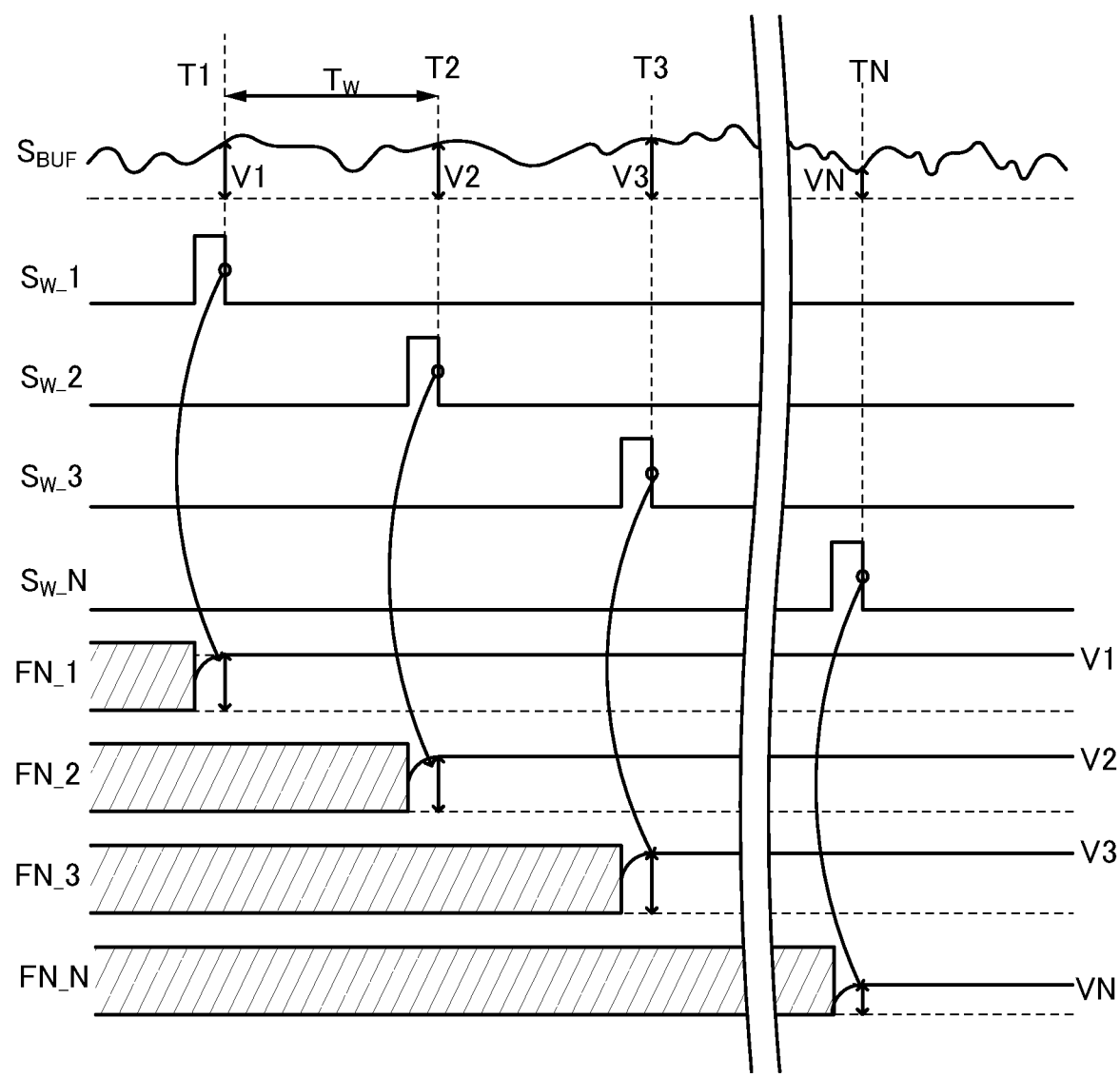
FIG. 4 is a timing chart showing operation of the semiconductor device.
Figure 5A:
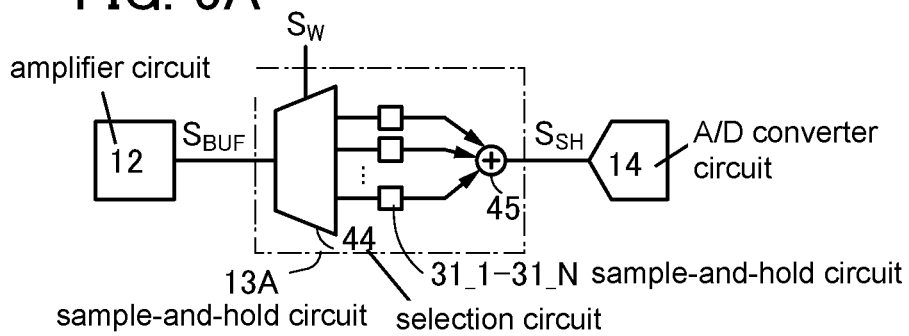
FIG. 5A, FIG. 5B, and FIG. 5C are a block diagram and circuit diagrams showing structures of a semiconductor device.
Figure 5B:
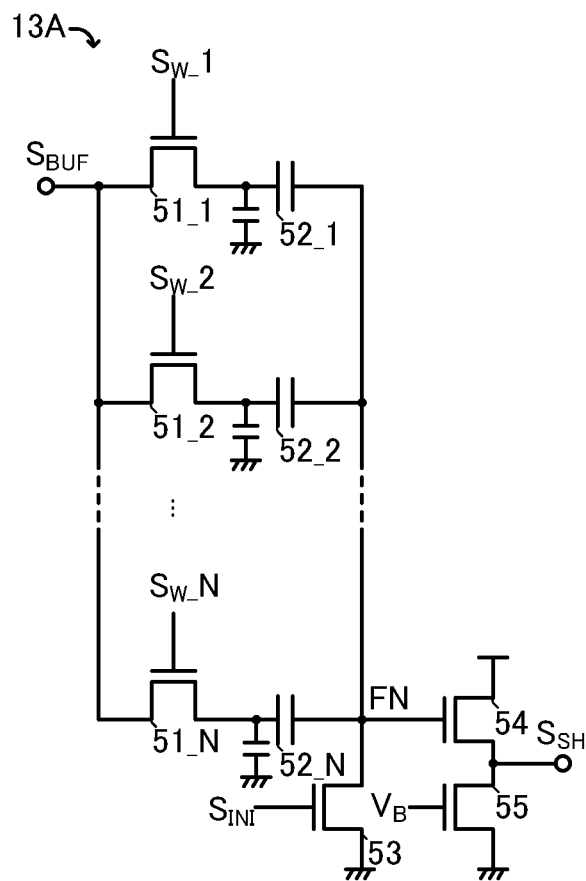
Figure 5C:
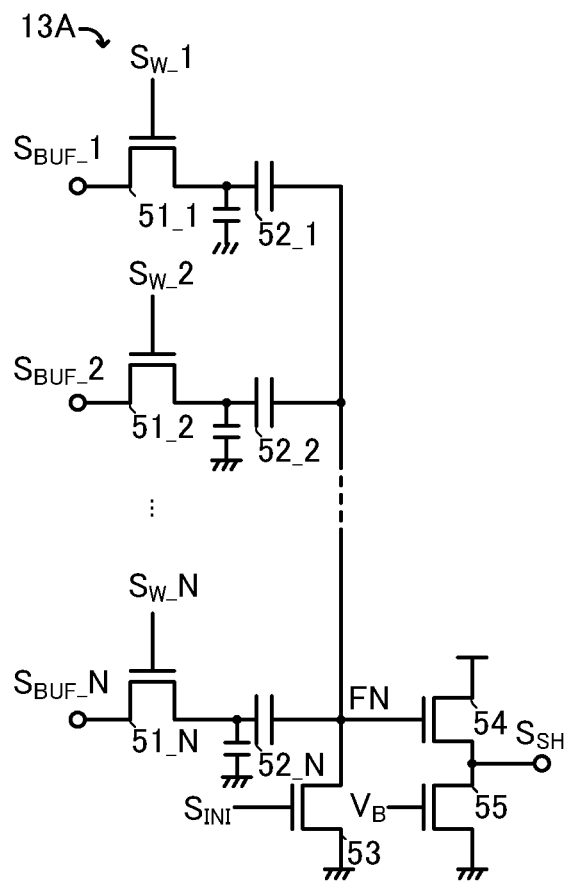
Figure 7:
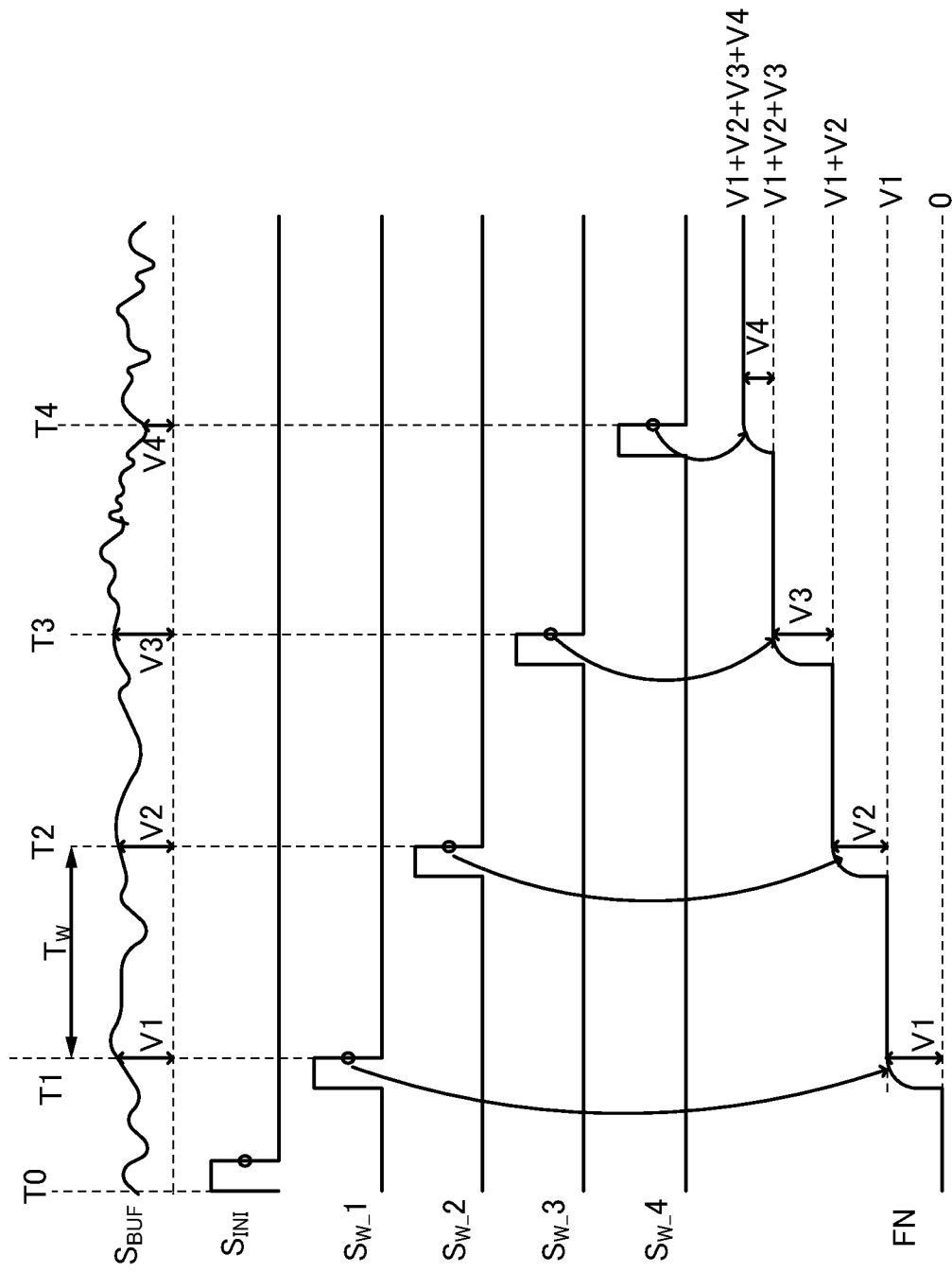
FIG. 7 is a timing chart showing operation of the semiconductor device.

Structure examples of the sample-and-hold circuits 13_1 to 13_N included in the semiconductor device 100A are described with reference to FIG. 3A and FIG. 3B. In FIG. 4, an operation example of the sample-and-hold circuits 13_1 to 13_N described in FIG. 3A and FIG. 3B is described. In addition, structure examples of the sample-and-hold circuit 13A including the signal holding circuits 31_1 to 31_N included in the semiconductor device 100B are described with reference to FIG. 5A to FIG. 5C. In FIG. 7, an operation example of the sample-and-hold circuit 13A described in FIG. 5A to FIG. 5C is described.

The sample-and-hold circuits 13_1 to 13_N illustrated in FIG. 3A include a selection circuit 41, a plurality of signal holding circuits 42, and a selection circuit 43. The selection circuit 41 is a circuit distributing the signals $S_{BUF}$ to the plurality of signal holding circuits 42 for sampling. The selection circuit 41 is a circuit that functions as a demultiplexer. The plurality of signal holding circuits 42 each correspond to a circuit formed using the transistors connected to the node FN for retaining a sampled analog voltage described in FIG. 1B. The selection circuit 43 is a circuit for selecting analog voltages retained in the plurality of signal holding circuits 42 as the signals $S_{SH}$ and sequentially outputting the signals $S_{SH}$. The selection circuit 41 is a circuit that functions as a multiplexer. The signal $S_w$ is a signal for controlling the selection circuit 41 that functions as a demultiplexer. A signal $S_R$ is a signal for controlling the selection circuit 43 that FIG. 3B illustrates a circuit diagram illustrating a specific structure example of the sample-and-hold circuits 13_1 to 13_N illustrated in FIG. 3A. FIG. 3B illustrates a transistor 21_1 to a transistor 21_N that function as the selection circuit 41. FIG. 3B illustrates nodes FN_1 to FN_N that are included in the signal holding circuits 42 and are connected to ones of sources and drains of the transistor 21_1 to the transistor 21_N and gates of a transistor 22_1 to a transistor 22_N. A transistor 24_1 to a transistor 24_N that function as the selection circuit 43 are illustrated.

Each transistor included in the sample-and-hold circuits 13_1 to 13_N is an OS transistor. With the use of OS transistors as the transistors included in the sample-and-hold circuits 13_1 to 13_N, an analog voltage obtained by sampling of the signal $S_{BUF}$ can be retained in the node FN thanks to an extremely low leakage current (hereinafter off-state current) flowing between sources and drains at the time when the transistors are off. Therefore, even with a structure where the analog voltage is retained as it is without immediate A/D conversion after acquisition of the analog voltage and is then read, a highly accurate output signal can be obtained, and the power consumption of the semiconductor device 100A can be reduced.

In FIG. 3B, the signals $S_w$ for sampling the signal $S_{BUF}$ are denoted by a signal $S_{w\_1}$ to a signal $S_{w\_N}$. In FIG. 3B, the signals $S_R$ for sequentially reading a plurality of retained analog voltages as the signals $S_{SH}$ are denoted by a signal $S_{R\_1}$ to a signal $S_{R\_N}$. The sample-and-hold circuits 13_1 to 13_N illustrated in FIG. 3A and FIG. 3B perform sampling of the signal $S_{BUF}$ N times at different timings so that analog voltages are retained in the nodes FN_1 to FN_N that function as the signal holding circuits 42. In addition, the sample-and-hold circuits 13_1 to 13_N illustrated in FIG. 3A and FIG. 3B output the analog voltages retained in the nodes FN_1 to FN_N that function as the signal holding circuits 42, as the signals $S_{SH\_N}$ times at different timings.

FIG. 4 is a timing chart for describing operation of sampling the signal $S_{BUF}$ by the sample-and-hold circuits 13_1 to 13_N illustrated in FIG. 3A and FIG. 3B. FIG. 4 illustrates the signal $S_{w\_1}$ to the signal $S_{w\_3}$, the signal $S_{w\_N}$, the nodes FN_1 to FN_3, and the node F_N together with the waveform of the signal $S_{BUF}$. Operation from Time T1 to Time TN is described in FIG. 4. Note that in the diagram for describing the timing chart, periods with hatching are periods in an indefinite state. Note that in the periods described in FIG. 4, the signal $S_{R\_1}$ to the signal $S_{R\_N}$ (not illustrated) are at an L level.

At Time T1, the signal $S_{W\_1}$ is set to an H level and a voltage V1 of the signal $S_{BUF}$ is written to the node FN_1, so that sampling of the signal $S_{BUF}$ is performed.

At Time T2 after the elapse of a period $T_W$, the signal $S_{W\_2}$ is set to an H level, and a voltage V2 of the signal $S_{BUF}$ is written to the node FN_2, so that sampling of the signal $S_{BUF}$ is performed.

Similarly, at Time T3 after the elapse of the period $T_W$, the signal $S_{W\_3}$ is set to an H level, and a voltage V3 of the signal $S_{BUF}$ is written to the node FN_3, so that sampling of the signal $S_{BUF}$ is performed. In addition, at Time TN, the signal $S_{W\_N}$ is set to an H level, and a voltage VN of the signal $S_{BUF}$ is written to the node FN_N, so that sampling of the signal $S_{BUF}$ is performed. The voltages V1 to VN retained in the node FN_1 to the node FN_N can be retained when the signals $S_{W\_1}$ to $S_{W\_N}$ are set to an L level.

The sample-and-hold circuit 13A illustrated in FIG. 5A includes a selection circuit 44, the plurality of signal holding circuits 31_1 to 31_N, and an adder circuit 45. The selection circuit 44 is a circuit distributing the signals $S_{BUF}$ to the plurality of signal holding circuits 31_1 to 31_N for sampling. The selection circuit 44 is a circuit that functions as a demultiplexer. The plurality of signal holding circuits 42 correspond to circuits formed using the transistors and capacitors connected to the node FN. The adder circuit 45 corresponds to a circuit that adds potentials in such a manner that a potential change due to sampling by the selection circuit 44 is applied to one electrode of the capacitor so that the node FN connected to the other electrode of the capacitor is changed through capacitive coupling. The signal $S_w$ is a signal for controlling the selection circuit 44 that functions as a demultiplexer.

FIG. 5B illustrates a circuit diagram illustrating a specific structure example of the sample-and-hold circuit 13A illustrated in FIG. 5A. FIG. 5B illustrates a transistor 51_1 to a transistor 51_N that function as the selection circuit 44. FIG. 5B illustrates the transistor 51_1 to the transistor 51_N that are included in the signal holding circuits 31_1 to 31_N and capacitors 52_1 to 52_N that are connected to ones of sources and drains of the transistor 51_1 to the transistor 51_N. FIG. 5B illustrates the node FN that is connected to the capacitors 52_1 to 52_N, one of a source and a drain of a transistor 53, and a gate of a transistor 54 that is an input terminal of a source-follower circuit. FIG. 5B illustrates a structure where the bias voltage $V_B$ of the source-follower circuit is applied to a gate of a transistor 55. A signal $S_{INI}$ is input to a gate of the transistor 53. The signal $S_{INI}$ is a signal for initializing the potential of the node FN.

In FIG. 5B, the signals $S_w$ for sampling the signal $S_{BUF}$ are denoted by the signal $S_{w\_1}$ to the signal $S_{w\_N}$. The sample-and-hold circuit 13A illustrated in FIG. 5A and FIG. 5B performs sampling of the signal $S_{BUF}$ N times at different timings and adds voltages obtained by the sampling through capacitive coupling of the capacitors 52_1 to 52_N that function as the adder circuit 45. A voltage corresponding to the sum of voltages obtained by addition is retained in the node FN. The analog voltage retained in the node FN is output as the signal $S_{SH}$ through the transistors 54 and 55 that function as the source-follower circuit. Note that a capacitor for holding electric charge obtained by sampling is provided for a node between any one of the transistor 51_1 to the transistor 51_N and any one of the capacitors 52_1 to 52_N. When electrostatic capacitance (simply referred to as capacitance) of the capacitor is made larger than the capacitance of the node FN, fluctuation due to the potential change of the node FN can be suppressed.

Each transistor included in the sample-and-hold circuit 13A is an OS transistor. With the use of OS transistors as the transistors included in the sample-and-hold circuit 13A, an analog voltage obtained by sampling of the signal $S_{BUF}$ can be retained in the node FN thanks to an extremely low leakage current (hereinafter off-state current) flowing between sources and drains at the time when the transistors are off. Therefore, even with a structure where the analog voltage is retained as it is without immediate A/D conversion after acquisition of the analog voltage and is then read, a highly accurate output signal can be obtained, and the power consumption of the semiconductor device 100B can be reduced.

Note that although FIG. 5B illustrates the signal sampled through the transistor 51_1 to the transistor 51_N as the signal $S_{BUF}$, another structure may be employed. For example, as illustrated in FIG. 5C, a structure may be employed in which signals $S_{BUF\_1}$ to $S_{BUF\_N}$ that are output from separate amplifier circuits are sampled through the transistor 51_1 to the transistor 51_N.

Figure 6:
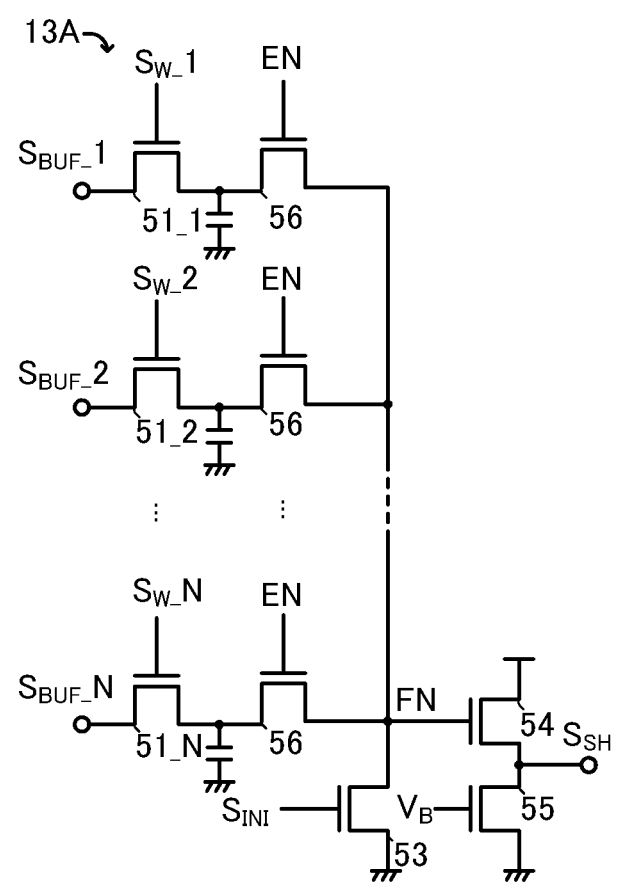
FIG. 6 is a circuit diagram showing a structure of the semiconductor device.

Note that although FIG. 5B and FIG. 5C each illustrate the structure where sampling of the signal $S_{BUF}$ is performed N times at different timings and voltages obtained by the sampling are added through capacitive coupling, another structure may be employed. A structure illustrated in FIG. 6 can be employed, for example. The structure in FIG. 6 illustrates a structure where the capacitors 52_1 to 52_N are replaced with transistors 56. In the structure in FIG. 6, at the time of sampling operation, the transistor 51_1 to the transistor 51_N are sequentially turned on and the transistors 56 are turned off by control signals EN. A voltage that is obtained by a voltage obtained by sampling is retained in a capacitor of a node between any one of the transistor 51_1 to the transistor 51_N and the transistor 56. At the time of addition, the transistors 56 are simultaneously turned on by the control signals EN, electric charge corresponding to a voltage retained at the time of sampling is distributed to the node FN, and a voltage corresponding to the sum of voltages obtained by addition in the node FN can be obtained.

FIG. 7 is a timing chart for describing operation of sampling the signal $S_{BUF}$ by the sample-and-hold circuit 13A illustrated in FIG. 5A and FIG. 5B. FIG. 7 illustrates the signal $S_{INI}$, the signal $S_{w\_1}$ to a signal $S_{w\_4}$, and the node FN together with the waveform of the signal $S_{BUF}$. Operation from Time T1 to Time T4 is described in FIG. 7. Note that in the diagram for describing the timing chart, periods with hatching are periods in an indefinite state.

At Time T0, the signal $S_{INI}$ is set at an H level so that the node FN is initialized (for example, 0 V). After that, the signal $S_{INI}$ is set at an L level, and the node FN is brought into an electrically floating state.

At Time T1, the signal $S_{w\_1}$ is set at an H level, and the voltage V1 of the signal $S_{BUF}$ is applied to one electrode of the capacitor 52_1. Since the node FN that corresponds to a potential of the other electrode of the capacitor 52_1 is in an electrically floating state, the potential of the node FN is increased in accordance with a potential change due to sampling of the voltage V1. Note that for simplicity, in the description of FIG. 7, the parasitic capacitance of the node FN is much smaller than the capacitance of the capacitors 52_1 to 52_N. Thus, the increase in the potential of the node FN is denoted by V1. After that, the signal $S_{w\_1}$ is set at an L level, and the voltage V1 is retained in the node FN.

At Time T2, the signal $S_{w\_2}$ is set at an H level, and the voltage V2 of the signal $S_{BUF}$ is applied to one electrode of the capacitor 52_2. Since the node FN that corresponds to a potential of the other electrode of the capacitor 52_2 is in an electrically floating state, the potential of the node FN is increased in accordance with a potential change due to sampling of the voltage V2. The increase in the potential of the node FN is denoted by V1+V2, which indicates an increase from V1 by V2. After that, the signal $S_{w\_2}$ is set at an L level, and the voltage V1+V2 is retained in the node FN.

At Time T3, the signal $S_{w\_3}$ is set at an H level, and the voltage V3 of the signal $S_{BUF}$ is applied to one electrode of a capacitor 52_3. Since the node FN that corresponds to a potential of the other electrode of the capacitor 52_3 is in an electrically floating state, the potential of the node FN is increased in accordance with a potential change due to sampling of the voltage V3. The increase in the potential of the node FN is denoted by V1+V2+V3, which indicates an increase from V1+V2 by V3. After that, the signal $S_{w\_3}$ is set at an L level, and the voltage V1+V2+V3 is retained in the node FN.

At Time T4, the signal $S_{w\_4}$ is set at an H level, and a voltage V4 of the signal $S_{BUF}$ is applied to one electrode of a capacitor 52_4. Since the node FN that corresponds to a potential of the other electrode of the capacitor 52_4 is in an electrically floating state, the potential of the node FN is increased in accordance with a potential change due to sampling of the voltage V4. The increase in the potential of the node FN is denoted by V1+V2+V3+V4, which indicates an increase from V1+V2+V3 by V4. After that, the signal $S_{w\_4}$ is set at an L level, and the voltage V1+V2+V3+V4 is retained in the node FN.

Note that for simplicity of the description of the potential change of the node FN in FIG. 7, the voltage obtained by sampling is added as it is; however, in an actual circuit configuration, parasitic capacitance exists between wirings and in an element such as a transistor. Accordingly, a voltage according to addition, for example, (V1+V2+V3+V4)/a (a: constant) is obtained in the node FN.

Through the above operations, the voltage to which the voltages obtained by sampling are added can be retained in the node FN. The retained voltage can be output to the A/D converter circuit 14 through the source-follower circuit at predetermined timing.

With the operations described in FIG. 3 to FIG. 7, the semiconductor devices 100A and 100B according to one embodiment of the present invention can each provide a semiconductor device having a novel structure and functioning as a sensor-equipped signal processing device for achieving low power consumption. One embodiment of the present invention can provide a semiconductor device having a novel structure allowing prolonged driving and functioning as a sensor-equipped signal processing device. Another object of one embodiment of the present invention can provide a semiconductor device with a novel structure that can retain a sensor signal as an analog voltage even under an environment where ambient temperature changes significantly. One embodiment of the present invention can provide a semiconductor device having a novel structure allowing low power consumption and highly accurate sampling and functioning as a sensor-equipped signal processing device.

Figure 8A:
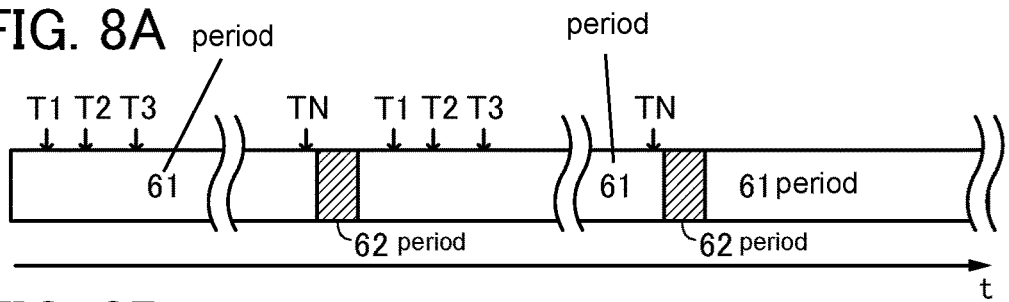
FIG. 8A, FIG. 8B, and FIG. 8C are diagrams showing structures of a semiconductor device.
Figure 8B:
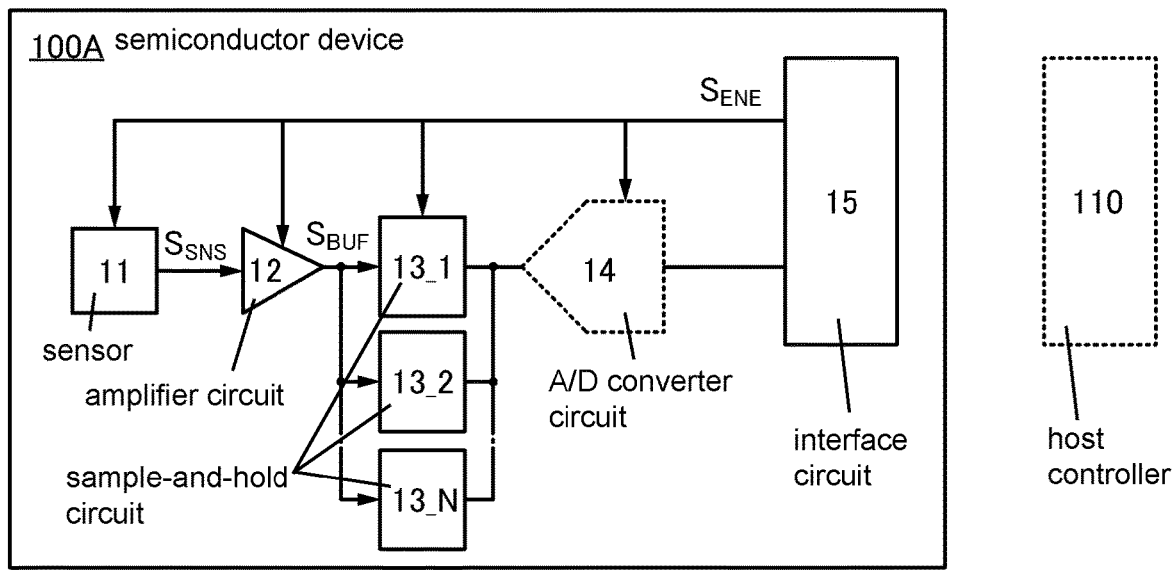
Figure 8C:
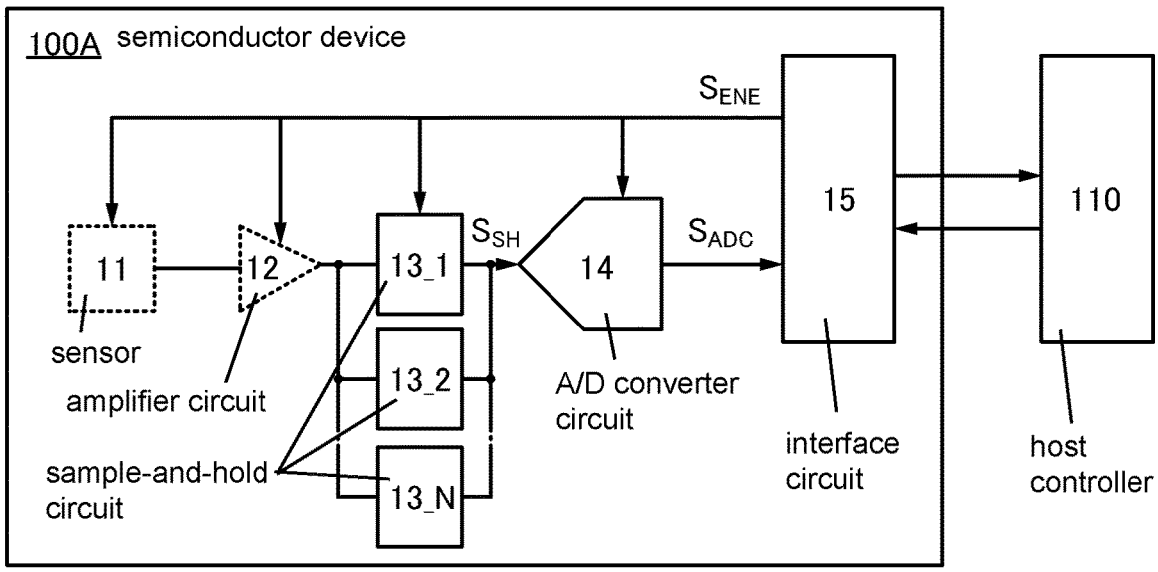

Operation of the semiconductor device 100A including the signal holding circuits 31_1 to 31_N described in FIG. 3 and FIG. 4 is described using FIG. 8A to FIG. 8C.

FIG. 8A illustrates two operations in the semiconductor device 100A for separate periods. FIG. 8A illustrates that a period 61 and a period 62 are alternately switched.

The period 61 is a period during which the A/D converter circuit 14 does not operate and signals of the sensor 11 are periodically sampled. In the period 61, sampling of signals of the sensor 11 is illustrated as Time T1 to TN. Switching from the period 61 to the period 62 is preferably performed under the control of the host controller 110 or autonomously performed when the sampling number in the sensor 11 reaches the number that can be retained in the sample-and-hold circuits 13_1 to 13_N, specifically, the number of the sample-and-hold circuits 13_1 to 13_N.

The state of the semiconductor device 100A in the period 61 can be illustrated using a block diagram illustrated in FIG. 8B. In the block diagram in FIG. 8B, structures that are in a stop state or do not function are shown by dotted lines, and structures that function in an operation state are shown by solid lines. In a period during which sampling of signals of the sensor 11 is performed, the sensor 11, circuits such as the amplifier circuit 12 and the sample-and-hold circuits 13_1 to 13_N, and the interface circuit 15 for control can be in operation, and the A/D converter circuit 14 and the host controller 110 can be in non-operation. In other words, in the period 61, the interface circuit 15 performs control so that the signal of the sensor 11 is input to the amplifier circuit 12 and an output signal of the amplifier circuit 12 is retained in the sample-and-hold circuit 13.

The period 62 corresponds to a period during which the A/D converter circuit 14 operates so that a plurality of analog voltages obtained by sampling in the period 61 are subjected to A/D conversion and are output to the host controller 110. In other words, in the period 62, the interface circuit 15 performs control so that a digital signal that is obtained by output of a voltage retained in the sample-and-hold circuit 13 to the A/D converter circuit 14 is output to the interface circuit 15. In the period 62, sampling of signals of the sensor 11 is preferably stopped.

Switching from the period 62 to the period 61 is preferably performed under the control of the host controller 110 or autonomously performed when data transmission from the semiconductor device 100A to the host controller 110 is completed.

The state of the semiconductor device 100A in the period 62 can be illustrated using a block diagram illustrated in FIG. 8C. In the block diagram in FIG. 8C, structures that are in a stop state or do not function are shown by dotted lines, and structures that function in an operation state are shown by solid lines. In the period during which data that is acquired by the sensor 11 and corresponds to analog voltages retained in the sample-and-hold circuits 13_1 to 13_N is transmitted to the host controller 110, the A/D converter circuit 14, the interface circuit 15, and the host controller 110 can be in operation, and the sensor 11 and the amplifier circuit 12 can be in non-operation.

As illustrated in FIG. 8A, a structure is employed in which the operation in FIG. 8B that corresponds to the period 61 takes longer than the operation in FIG. 8C that corresponds to the period 62. A semiconductor device according to one embodiment of the present invention can have a structure where a plurality of analog voltages are retained. Accordingly, a structure that switches the period 61 during which the sensor-signal sampling operation with the A/D converter circuit stopped and the period 62 during which the A/D conversion operation on the retained analog voltage with the A/D converter circuit operated can achieve both acquisition of sensing data in every fixed period and a reduction in power consumption. When driving of the A/D converter circuit is minimized, the semiconductor device can achieve prolonged driving with the power from a battery.

Figure 9A:
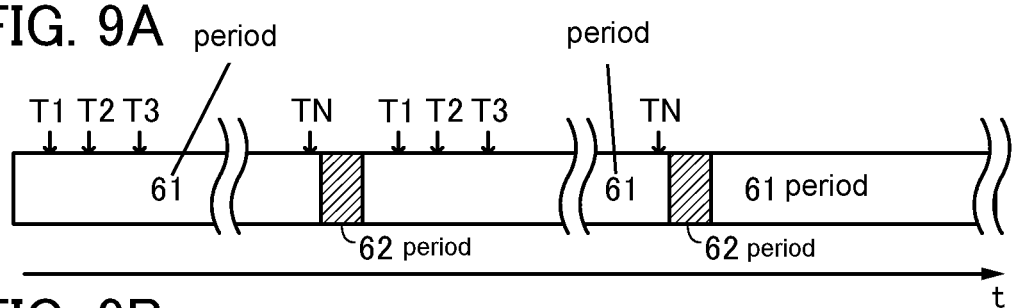
FIG. 9A, FIG. 9B, and FIG. 9C are diagrams showing structures of a semiconductor device.
Figure 9B:
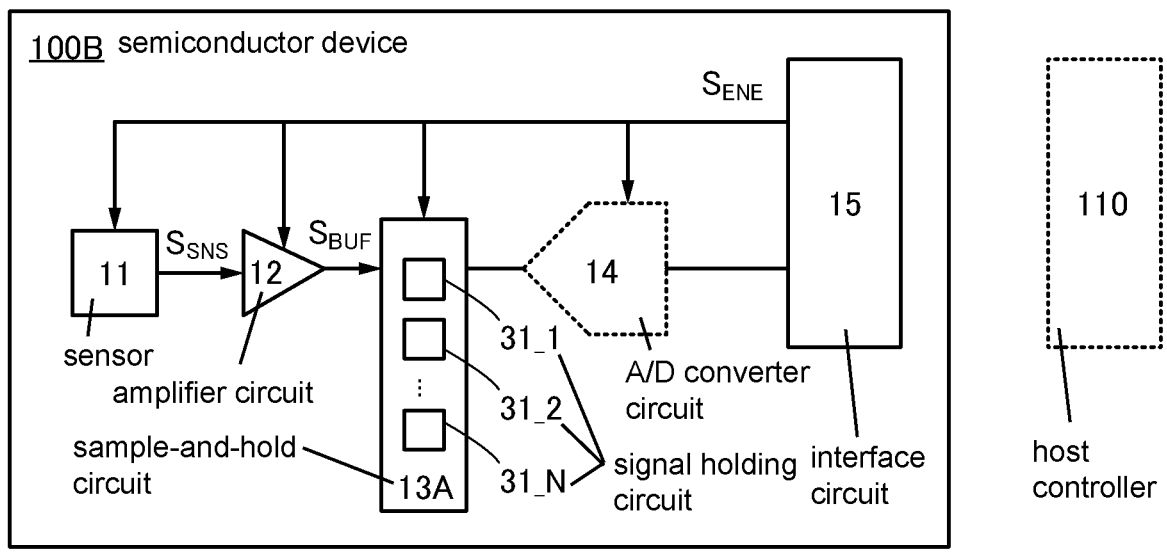
Figure 9C:
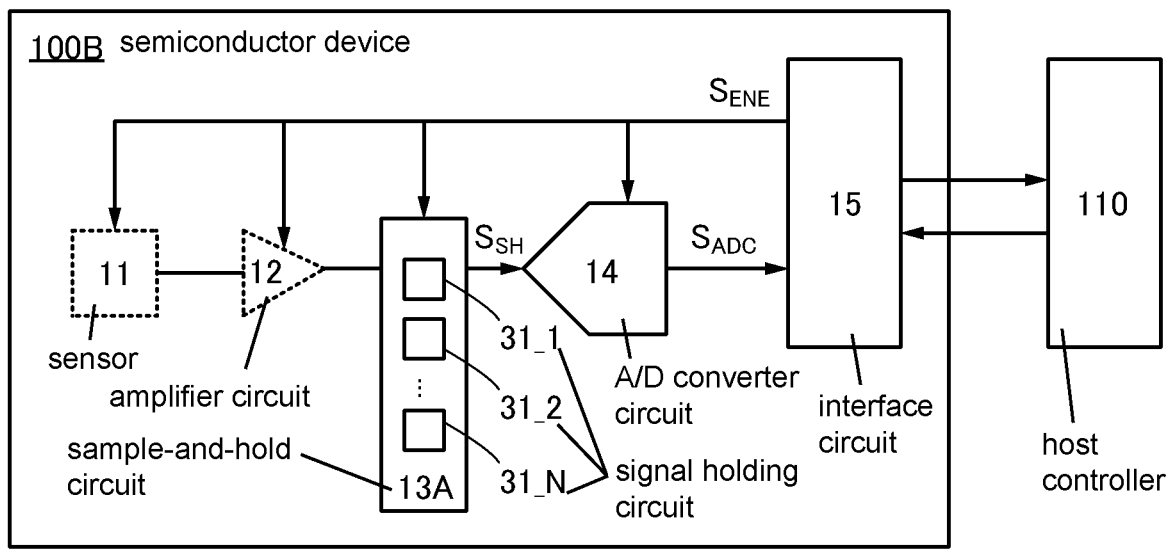

Operation of the semiconductor device 100B including a signal holding circuit 31A described in FIG. 5 and FIG. 7 is described using FIG. 9A to FIG. 9C.

FIG. 9A illustrates two operations in the semiconductor device 100B for separate periods. FIG. 9A illustrates that the period 61 and the period 62 are alternately switched. The description of FIG. 9A is similar to the description of FIG. 8A.

The state of the semiconductor device 100B in the period 61 can be illustrated using a block diagram illustrated in FIG. 9B. In the block diagram in FIG. 9B, structures that are in a stop state or do not function are shown by dotted lines, and structures that function in an operation state are shown by solid lines. In the period during which sampling of signals of the sensor 11 is performed, the sensor 11, the amplifier circuit 12, the sample-and-hold circuit 13A, and the interface circuit 15 for control can be in operation, and the A/D converter circuit 14 and the host controller 110 can be in non-operation.

The state of the semiconductor device 100B in the period 62 can be illustrated using a block diagram illustrated in FIG. 9C. In the block diagram in FIG. 9C, structures that are in a stop state or do not function are shown by dotted lines, and structures that function in an operation state are shown by solid lines. In the period during which data that is acquired by the sensor 11 and corresponds to analog voltages retained in the sample-and-hold circuits 13_1 to 13_N is transmitted to the host controller 110, the A/D converter circuit 14, the interface circuit 15, and the host controller 110 can be in operation, and the sensor 11 and the amplifier circuit 12 can be in non-operation.

In the operations of FIG. 8A to FIG. 8C and FIG. 9A to FIG. 9C, stop of power supply (power gating) to a circuit with large power consumption, such as the A/D converter circuit 14, can be performed in the period 61. Accordingly, the consumption of battery power can be reduced, and the prolonged autonomous operation of the semiconductor device can be achieved.

Figure 10A:
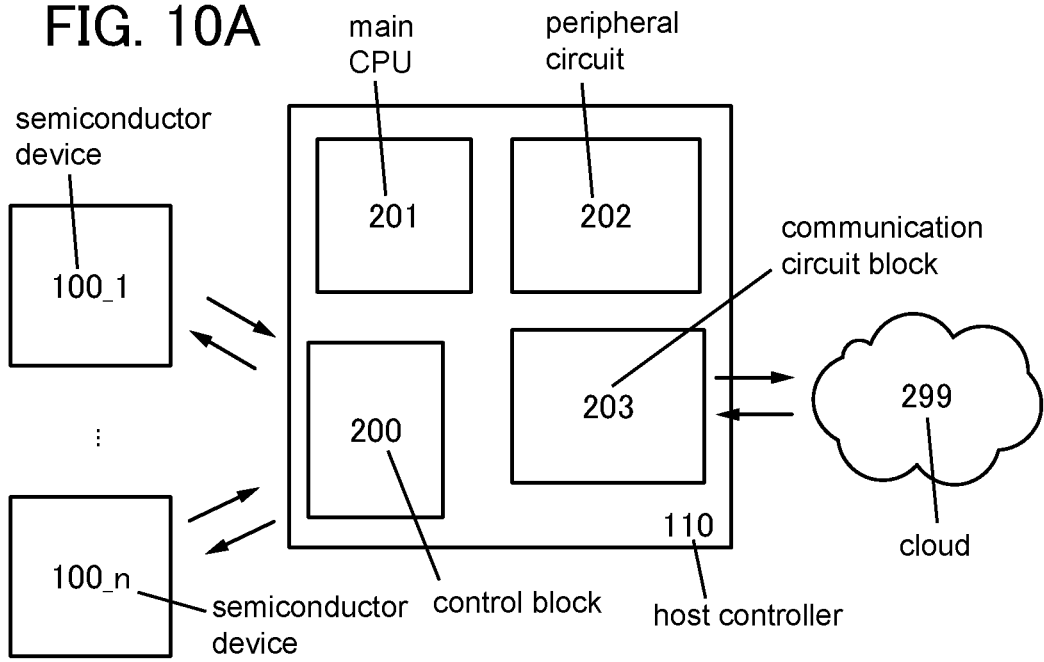
FIG. 10A and FIG. 10B are block diagrams each showing a structure of a semiconductor device.

FIG. 10A is a block diagram for describing a structure example of a plurality of semiconductor devices 100_1 to 100_$n$ (n is a natural number of one or more) and the host controller 110. The host controller 110 illustrated in FIG. 10A includes a control block 200, a main CPU 201, a peripheral circuit 202, and a communication circuit block 203, for example. FIG. 10A also illustrates a cloud 299 as the above equipment to which data collected by the host controller 110 is transmitted.

The control block 200 is a circuit block that has a function of autonomously performing intermittent driving of an internal circuit in synchronization with the semiconductor devices 100_1 to 100_$n$. The control block 200 has a function of transmitting control signals for collecting data that correspond to analog voltages collected by the sample-and-hold circuit 13 in the semiconductor devices 100_1 to 100_$n$ and a function of receiving signals transmitted from the semiconductor devices 100_1 to 100_$n$.

The main CPU 201 and the peripheral circuit 202 are circuit blocks that include a processor for performing control in the host controller 110, a memory for storing data, an oscillator, and the like.

The communication circuit block 203 has a function of transmitting a variety of data that are collected from the semiconductor devices 100_1 to 100_$n$ by the host controller 110 to the cloud 299 and a function of acquiring data needed for the host controller 110 from the cloud 299.

Figure 10B:
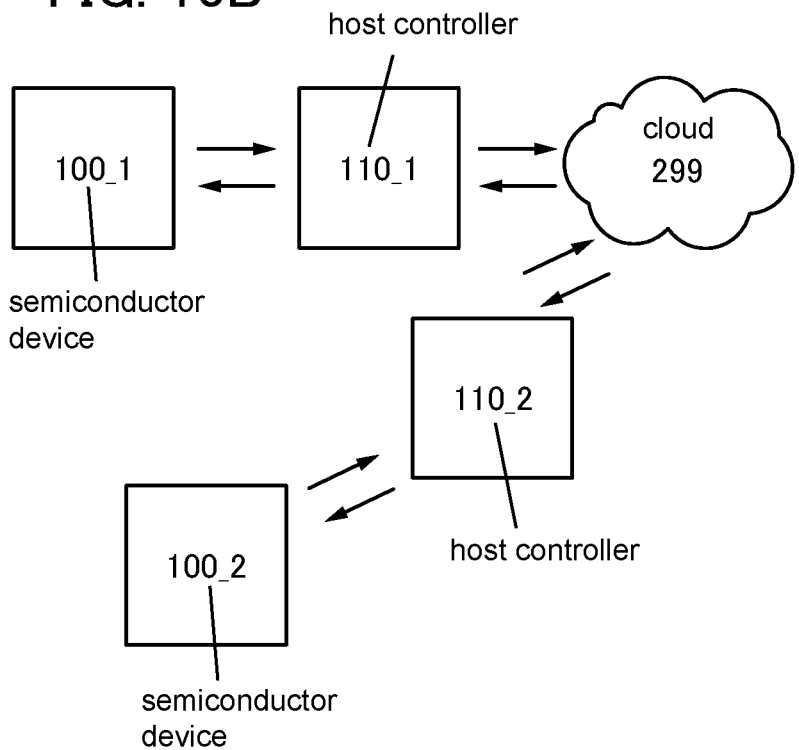

Note that FIG. 10A illustrates a plurality of semiconductor devices with respect to one host controller; however, one semiconductor device may correspond to one host controller. Alternatively as illustrated in FIG. 10B, a structure can be employed in which data needed for the plurality of host controllers 110_1 and 110_2 and the cloud 299 are collected from the plurality of semiconductor devices 100_1 and 100_2.

With a reduction in the power consumption of the semiconductor device, data can be acquired from a plurality of sensors capable of autonomously operating for a long time. Consequently, a highly convenient sensor system can be constructed.

Figure 11A:
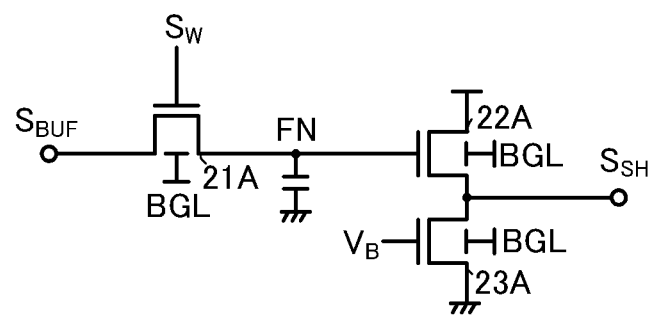
FIG. 11A and FIG. 11B are circuit diagrams each showing a structure of a semiconductor device.
Figure 11B:
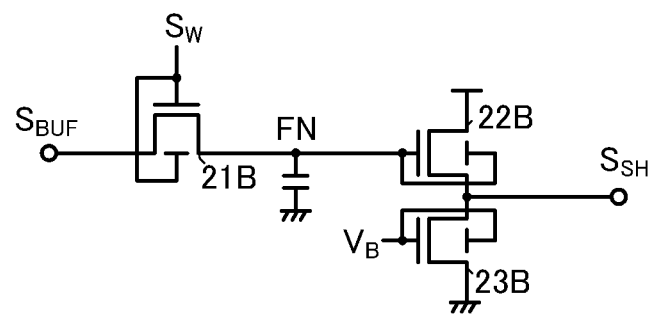

FIG. 11A and FIG. 11B illustrate modification examples of a circuit configuration applicable to each transistor included in the sample-and-hold circuit 13 described above.

The transistors 21 to 23 in FIG. 1B and the like each have a top-gate structure or a bottom-gate transistor without a back gate electrode; however, the structures of the transistors 21 to 23 are not limited thereto. For example, like a sample-and-hold circuit 13B illustrated in FIG. 11A, transistors 21A to 23A each including a back gate electrode connected to a back gate electrode line BGL may also be used. With the structure in FIG. 11A, the states of the transistors 21A to 23A can be easily controlled from the outside.

Alternatively, like a sample-and-hold circuit 13C illustrated in FIG. 11B, transistors 21B to 23B each including a back gate electrode connected to a gate electrode may be used. With the structure in FIG. 11B, the amount of current flowing through the transistors 21B to 23B can be increased.

Figure 12:
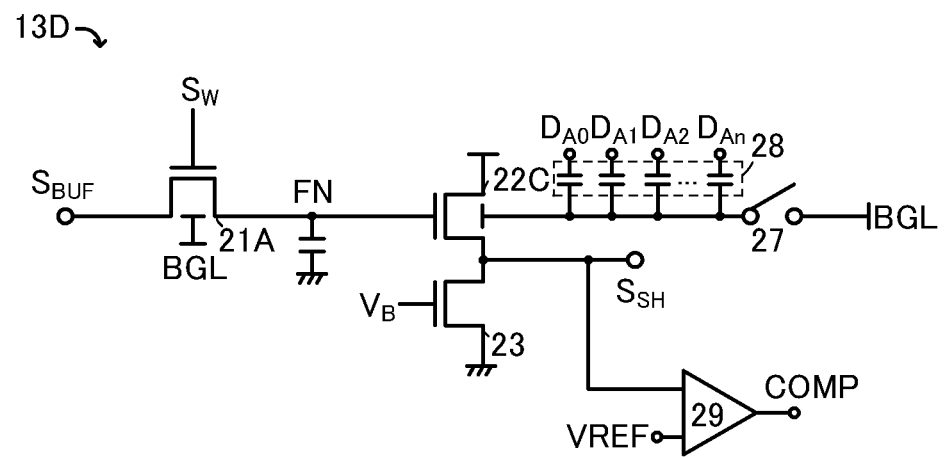
FIG. 12 is a circuit diagram showing a structure of a semiconductor device.

Alternatively, the structure of the sample-and-hold circuit 13D illustrated in FIG. 12 may be used. FIG. 12 includes a switch 27, a plurality of capacitors 28, and a comparator 29 in addition to the structure in FIG. 1B. The switch 27 and the plurality of capacitors 28 have a function of adjusting the threshold voltage of a transistor 22C by adjusting a voltage applied to the back gate electrode line BGL. The threshold voltage is adjusted in such a manner that the comparator 29 monitors the voltage of the signal $S_{SH}$ with reference to a reference voltage VREF and signals $D_{A1}$ to $D_{AN}$ that are applied to one electrodes of the capacitors 28 are changed in accordance with the output of the comparator 29. With this structure, the threshold voltages of the transistor 22C and the transistor 23 can be equalized.

As described above, the semiconductor device according to one embodiment of the present invention can have a structure where a plurality of analog voltages are retained. Thus, a structure that switches the sensor-signal sampling operation with the A/D converter circuit stopped and the A/D conversion operation on the retained analog voltage with the A/D converter circuit operated can achieve both acquisition of sensing data in every fixed period and a reduction in power consumption. When driving of the A/D converter circuit is minimized, the semiconductor device can achieve prolonged driving with the power from the battery.

Embodiment 2

In this embodiment, a structure of a transistor applicable to the semiconductor device described in the above embodiment, specifically, a structure in which transistors having different electrical characteristics are stacked and provided will be described. In particular, in this embodiment, a structure of each transistor included in a delay circuit in the semiconductor device will be described. With the structure, the degree of flexibility in design of the semiconductor device can be increased. Furthermore, when transistors having different electrical characteristics are stacked and provided, the integration degree of the semiconductor device can be increased.

Figure 13:
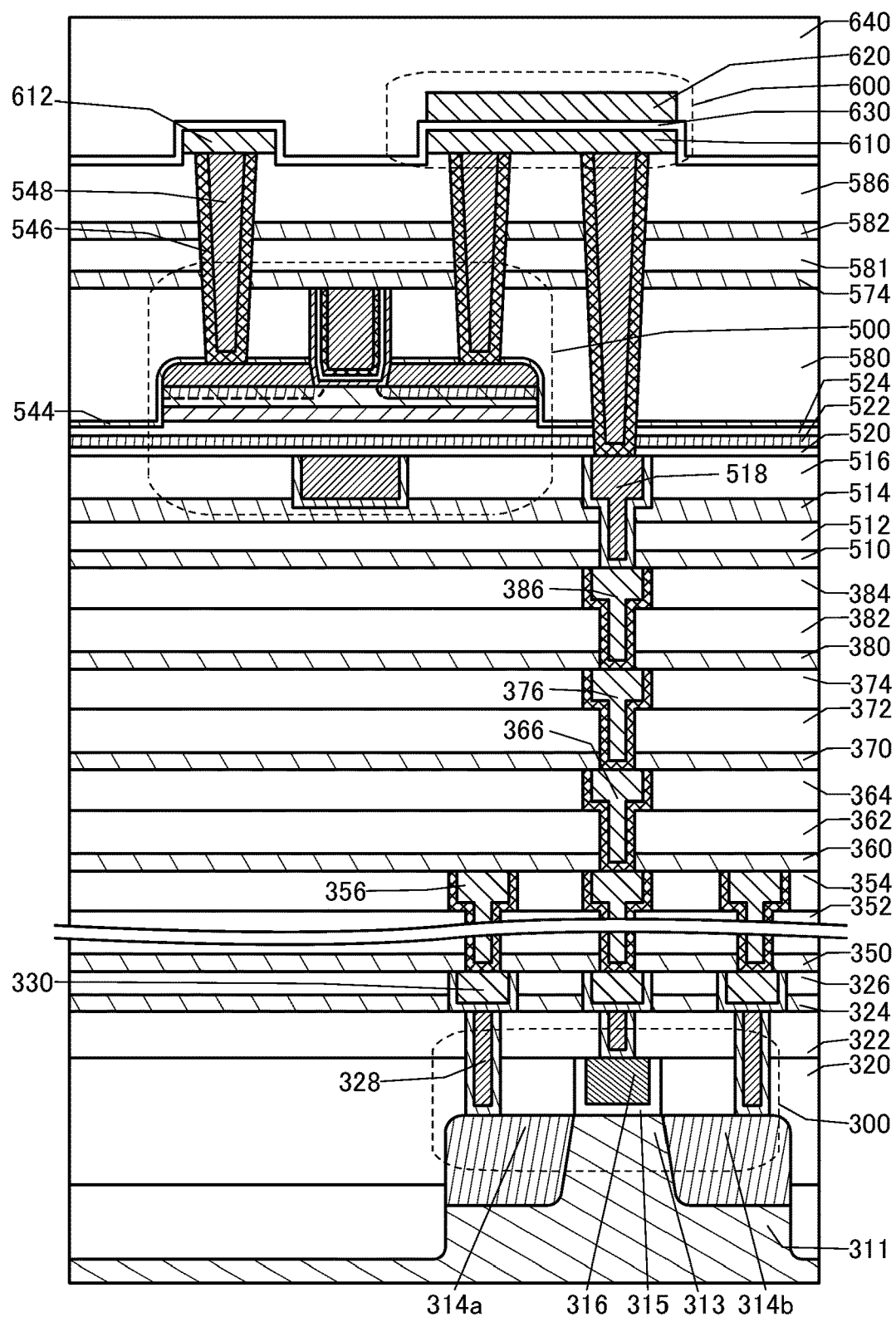
FIG. 13 is a cross-sectional schematic diagram showing operation of a semiconductor device.
Figure 15A:
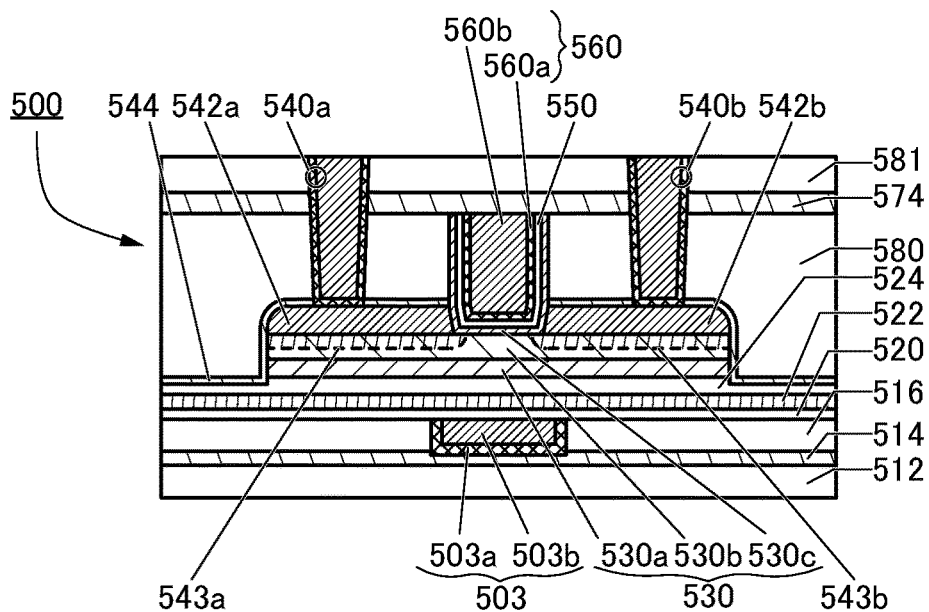
FIG. 15A, FIG. 15B, and FIG. 15C are cross-sectional schematic diagrams showing a structure of a semiconductor device.
Figure 15B:
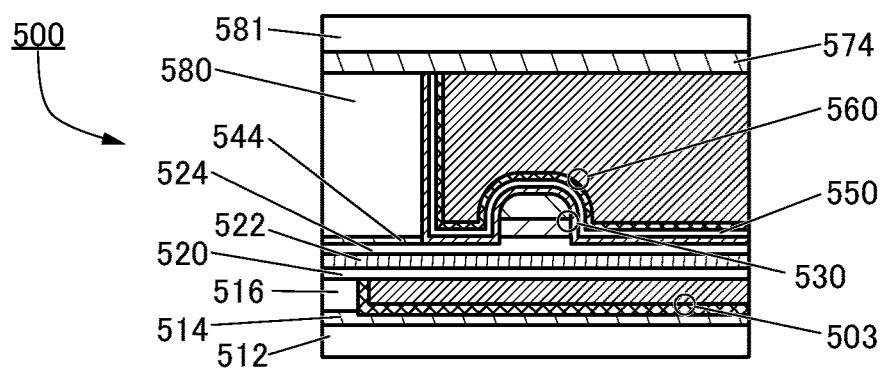
Figure 15C:
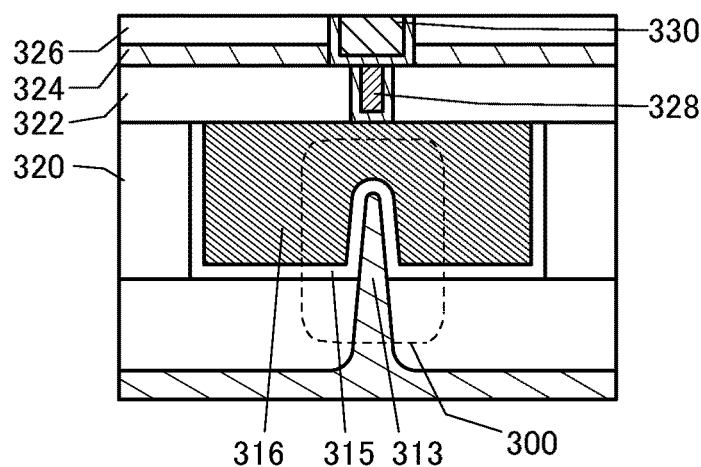

A semiconductor device shown in FIG. 13 includes a transistor 300, a transistor 500, and a capacitor 600. FIG. 15A is a cross-sectional view of the transistor 500 in the channel length direction. FIG. 15B is a cross-sectional view of the transistor 500 in the channel width direction. FIG. 15C is a cross-sectional view of the transistor 300 in the channel width direction.

The transistor 500 is a transistor containing a metal oxide in a channel formation region (an OS transistor). Since the off-state current of the transistor 500 is low, when the transistor 500 is used as an OS transistor included in the semiconductor device, written data can be retained for a long time. In other words, the frequency of refresh operation is low or refresh operation is not required; thus, the power consumption of the semiconductor device can be reduced.

The semiconductor device described in this embodiment includes the transistor 300, the transistor 500, and the capacitor 600, as shown in FIG. 13. The transistor 500 is provided above the transistor 300, and the capacitor 600 is provided above the transistor 300 and the transistor 500.

The transistor 300 is provided over a substrate 311 and includes a conductor 316, an insulator 315, a semiconductor region 313 that is part of the substrate 311, and a low-resistance region 314a and a low-resistance region 314b each functioning as a source region or a drain region. Note that the transistor 300 can be used as the transistor or the like included in the A/D converter circuit 14 in the above embodiment, for example.

As shown in FIG. 15C, in the transistor 300, a top surface and a side surface in the channel width direction of the semiconductor region 313 are covered with the conductor 316 with the insulator 315 therebetween. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as a source region or a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 14:
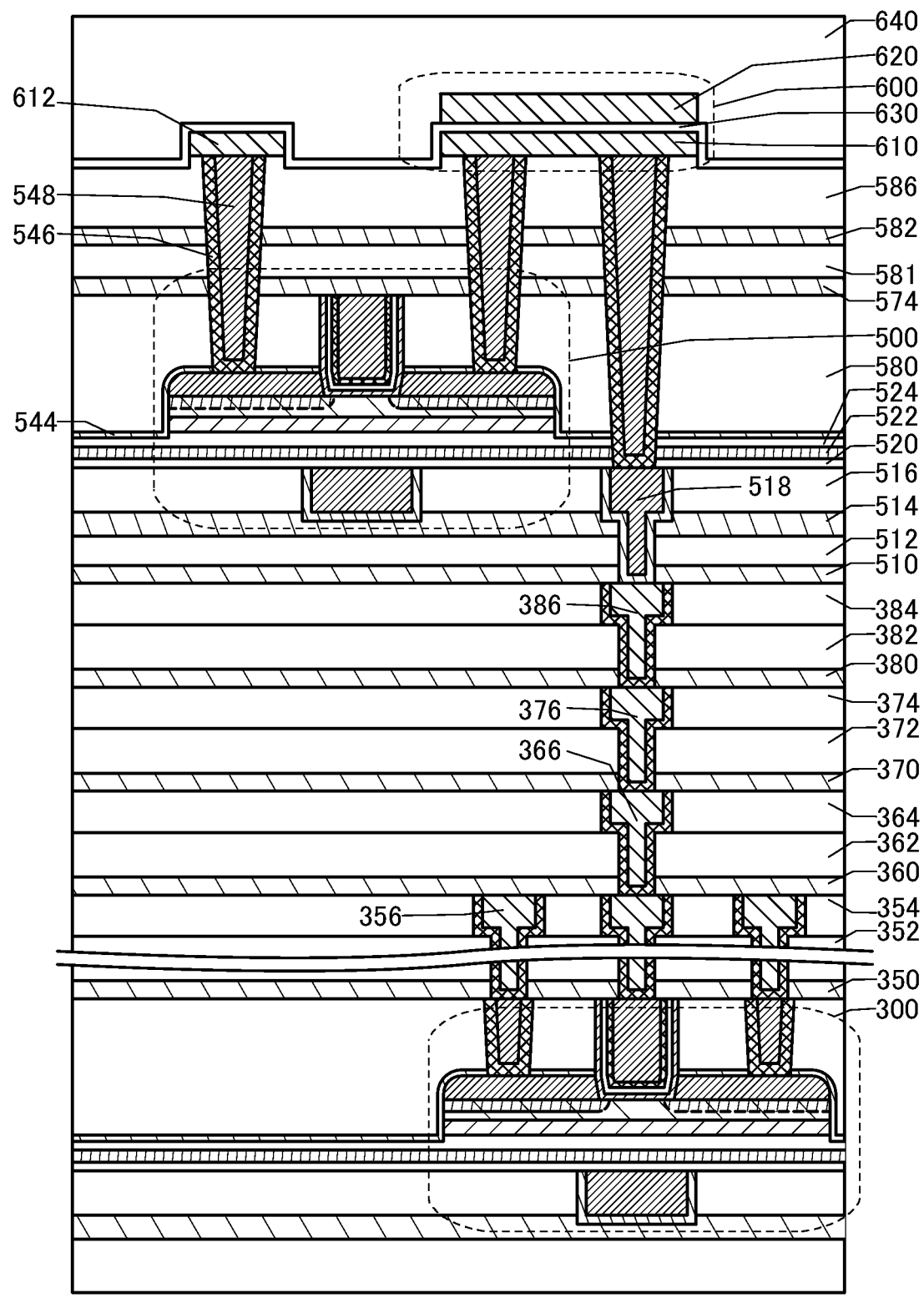
FIG. 14 is a cross-sectional schematic diagram showing a structure of a semiconductor device.

Note that the transistor 300 shown in FIG. 13 is an example and the structure is not limited thereto; an appropriate transistor is used in accordance with a circuit configuration or a driving method. For example, when the semiconductor device is a circuit having single polarity that is composed of only OS transistors, which means the same-polarity transistors such as n-channel transistors only, for example, the transistor 300 has a structure similar to that of the transistor 500 using an oxide semiconductor, as shown in FIG. 14. Note that the details of the transistor 500 are described later.

An insulator 320, an insulator 322, an insulator 324, and an insulator 326 are stacked sequentially and provided to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 13, an insulator 350, an insulator 352, and an insulator 354 are stacked sequentially and provided. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening of the insulator 350 having a barrier property against hydrogen. With this structure, the transistor 300 and the transistor 500 can be separated by a barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 13, an insulator 360, an insulator 362, and an insulator 364 are stacked sequentially and provided. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 13, an insulator 370, an insulator 372, and an insulator 374 are stacked sequentially and provided. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 13, an insulator 380, an insulator 382, and an insulator 384 are stacked sequentially and provided. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially and provided over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably provided between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low dielectric constant is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by a layer having a barrier property against oxygen, hydrogen, and water; thus, diffusion of hydrogen from the transistor 300 into the transistor 500 can be inhibited.

The transistor 500 is provided above the insulator 516.

As shown in FIG. 15A and FIG. 15B, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a ; a conductor 542a and a conductor 542b positioned apart from each other over the oxide 530b ; an insulator 580 that is positioned over the conductor 542a and the conductor 542b and is provided with an opening formed to overlap with a region between the conductor 542a and the conductor 542b ; an oxide 530c positioned on a bottom and a side surface of the opening; an insulator 550 positioned on a formation surface of the oxide 530c ; and a conductor 560 positioned on a formation surface of the insulator 550.

In addition, as shown in FIG. 15A and FIG. 15B, an insulator 544 is preferably positioned between the insulator 580 and the oxide 530a, the oxide 530b, the conductor 542a, and the conductor 542b. Furthermore, as shown in FIG. 15A and FIG. 15B, the conductor 560 preferably includes a conductor 560a provided inside the insulator 550 and a conductor 560b provided to be embedded inside the conductor 560a. Moreover, as shown in FIG. 15A and FIG. 15B, an insulator 574 is preferably positioned over the insulator 580, the conductor 560, and the insulator 550.

Note that in the following description, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 shown in FIG. 13 and FIG. 15A is an example and the structure is not limited thereto; an appropriate transistor is used in accordance with a circuit configuration or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 505 is not necessarily provided. Note that the conductor 503b is shown as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, further preferably greater than or equal to $2.0\times10^{19}$ atoms/cm$^3$ or greater than or equal to $3.0\times10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when reaction in which a bond of $V_OH$ is cut occurs, i.e., reaction of $V_OH \rightarrow V_O+H$ occurs. Part of hydrogen generated at this time is bonded to oxygen to be $H_2O$ and is removed from the oxide 530 or an insulator near the oxide 530 in some cases. In addition, part of hydrogen is diffused into or trapped (also referred to as gettering) by a conductor 542.

In addition, for the microwave treatment, for example, an apparatus including a power source that generates high-density plasma or an apparatus including a power source that applies RF to a substrate side is suitably used. For example, high-density oxygen radicals can be generated with the use of an oxygen-containing gas and high-density plasma, and by applying RF to the substrate side, the oxygen radicals generated by high-density plasma can be efficiently introduced into the oxide 530 or the insulator near the oxide 530. Furthermore, pressure in the microwave treatment is higher than or equal to 133 Pa, preferably higher than or equal to 200 Pa, further preferably higher than or equal to 400 Pa. Moreover, as a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In addition, in the manufacturing process of the transistor 500, the heat treatment is preferably performed with the surface of the oxide 530 exposed. The heat treatment is performed at higher than or equal to 100° C. and lower than or equal to 450° C., further preferably higher than or equal to 350° C. and lower than or equal to 400° C., for example. Note that the heat treatment is performed in a nitrogen gas or inert gas atmosphere, or an atmosphere containing an oxidizing gas at higher than or equal to 10 ppm, higher than or equal to 1%, or higher than or equal to 10%. For example, the heat treatment is preferably performed in an oxygen atmosphere. Accordingly, oxygen can be supplied to the oxide 530 to reduce oxygen vacancies ($V_O$). Alternatively, the heat treatment may be performed under reduced pressure. Alternatively, the heat treatment may be performed in such a manner that heat treatment is performed in a nitrogen gas or inert gas atmosphere, and then heat treatment is performed in an atmosphere containing an oxidizing gas at higher than or equal to 10 ppm, higher than or equal to 1%, or higher than or equal to 10% in order to compensate for released oxygen. Alternatively, the heat treatment may be performed in such a manner that heat treatment is performed in an atmosphere containing an oxidizing gas at higher than or equal to 10 ppm, higher than or equal to 1%, or higher than or equal to 10%, and then heat treatment is successively performed in a nitrogen gas or inert gas atmosphere.

Note that oxygen adding treatment performed on the oxide 530 can promote reaction in which oxygen vacancies in the oxide 530 are filled with supplied oxygen, i.e., reaction of $V_O+O\rightarrow$null. Furthermore, hydrogen remaining in the oxide 530 reacts with supplied oxygen, so that hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high dielectric constant.

Note that in the transistor 500 in FIG. 15A and FIG. 15B, the insulator 520, the insulator 522, and the insulator 524 are shown as the second gate insulating film having a stacked-layer structure of three layers; however, the second gate insulating film may be a single layer or may have a stacked-layer structure of two layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one kind or a plurality of kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS or a CAC-OS. Furthermore, as the oxide 530, an In—Ga oxide or an In—Zn oxide may be used.

Furthermore, a metal oxide with a low carrier concentration is preferably used for the transistor 500. In the case where the carrier concentration of the metal oxide is reduced, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Note that as examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. In addition, in the case where hydrogen enters an oxygen vacancy in the oxide 530, the oxygen vacancy and hydrogen are bonded to each other to form $V_OH$ in some cases. The $V_OH$ serves as a donor and an electron that is a carrier is generated in some cases. In other cases, bonding of part of hydrogen to oxygen bonded to a metal atom generates an electron serving as a carrier. Thus, a transistor using a metal oxide containing much hydrogen is likely to have normally-on characteristics. Moreover, hydrogen in a metal oxide is easily transferred by stress such as heat or an electric field; thus, a large amount of hydrogen in a metal oxide might reduce the reliability of a transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen adding treatment) to obtain a metal oxide whose $V_OH$ is sufficiently reduced. When a metal oxide with sufficiently reduced impurities such as $V_OH$ is used for a channel formation region of a transistor, the transistor can have stable electrical characteristics.

A defect in which hydrogen has entered an oxygen vacancy can function as a donor of the metal oxide. However, it is difficult to evaluate the defect quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, when a metal oxide is used for the oxide 530, hydrogen in the metal oxide is preferably reduced as much as possible. Specifically, the hydrogen concentration of the metal oxide that is obtained by secondary ion mass spectrometry (SIMS) is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with sufficiently reduced impurities such as hydrogen is used for a channel formation region of a transistor, the transistor can have stable electrical characteristics.

In addition, in the case where a metal oxide is used for the oxide 530, the carrier concentration of the metal oxide in the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$.

Furthermore, in the case where a metal oxide is used for the oxide 530, contact between the conductor 542 (the conductor 542a and the conductor 542b) and the oxide 530 sometimes makes oxygen in the oxide 530 diffuse into the conductor 542, which results in oxidation of the conductor 542. It is highly probable that oxidation of the conductor 542 lowers the conductivity of the conductor 542. Note that diffusion of oxygen in the oxide 530 into the conductor 542 can be rephrased as absorption of oxygen in the oxide 530 by the conductor 542.

In addition, when oxygen in the oxide 530 is diffused into the conductor 542 (the conductor 542a and the conductor 542b), another layer is sometimes formed between the conductor 542a and the oxide 530b, and between the conductor 542b and the oxide 530b. The layer contains more oxygen than the conductor 542 does, and thus presumably has an insulating property. In this case, a three-layer structure of the conductor 542, the layer, and the oxide 530b can be regarded as a three-layer structure of a metal, an insulator, and a semiconductor and is sometimes referred to as a MIS (Metal-Insulator-Semiconductor) structure or a diode junction structure that mainly has a MIS structure.

Note that the layer is not necessarily formed between the conductor 542 and the oxide 530b; for example, the layer is sometimes formed between the conductor 542 and the oxide 530c, or the layer is sometimes formed between the conductor 542 and the oxide 530b and between the conductor 542 and the oxide 530c.

In addition, the metal oxide functioning as the channel formation region in the oxide 530 has a band gap of more than or equal to 2 eV, preferably more than or equal to 2.5 eV. With the use of a metal oxide having such a wide bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, a metal oxide that can be used as the oxide 530a or the oxide 530b can be used as the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 15, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 15A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (a top surface and a side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as a leakage current might arise because of a thinner gate insulating film. For that reason, when the insulating film functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is shown in FIG. 15A and FIG. 15B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low dielectric constant is used for these insulators, parasitic capacitance between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. Note that when an opening is formed to surround the transistor 500, for example, formation of an opening reaching the insulator 514 or the insulator 522 and formation of the insulator having a high barrier property to be in contact with the insulator 514 or the insulator 522 are suitable because these formation steps can also serve as some of the manufacturing steps of the transistor 500. Note that the insulator having a high barrier property against hydrogen or water is formed using a material similar to that for the insulator 522, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in FIG. 13, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

With the use of this structure, a semiconductor device using a transistor including an oxide semiconductor can be miniaturized or highly integrated.

Embodiment 3

In this embodiment, application examples of the semiconductor device will be described.

<Example of Method for Manufacturing Electronic Component>

Figure 16A:
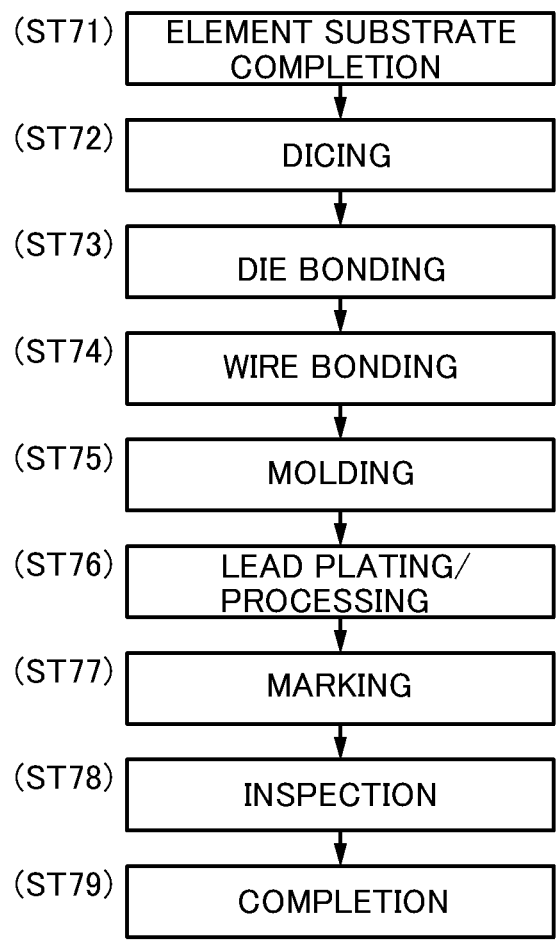
FIG. 16A, FIG. 16B, FIG. 16C, FIG. 16D, and FIG. 16E are a flow chart showing a method for forming an electronic component and diagrams each showing a structure of an electronic component.

FIG. 16A is a flow chart showing an example of a method for manufacturing an electronic component. The electronic component is also referred to as a semiconductor package or an IC package. The electronic component described below corresponds to an electronic component provided with each transistor included in the semiconductor device.

A semiconductor device formed using a transistor is completed by integrating detachable components on a printed circuit board through an assembly process (post-process). The post-process can be completed through steps shown in FIG. 16A. Specifically, after an element substrate obtained in a pre-process is completed (Step ST71), a rear surface of the substrate is ground. The substrate is thinned down at this stage to reduce warpage or the like of the substrate in the pre-process and to reduce the size of the component. Then, a dicing step of dividing the substrate into a plurality of chips is performed (Step ST72).

Figure 16B:
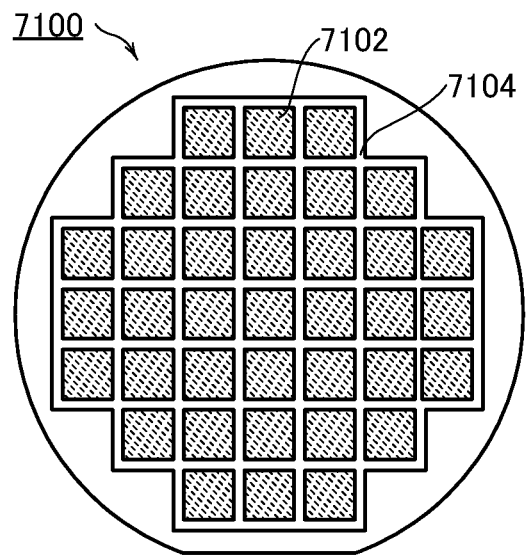
Figure 16C:
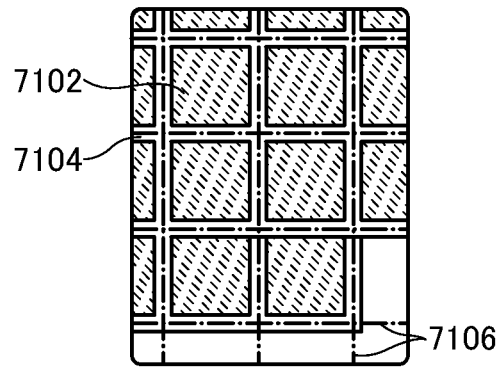

FIG. 16B is a top view of a semiconductor wafer 7100 before a dicing step. FIG. 16C is an enlarged view of part of FIG. 16B. A plurality of circuit regions 7102 are provided on the semiconductor wafer 7100. The semiconductor device of an embodiment of the present invention is provided in the circuit region 7102.

Figure 16D:
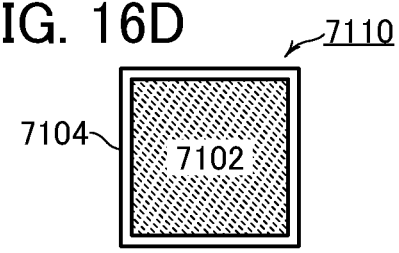

The plurality of circuit regions 7102 are each surrounded by a separation region 7104. Separation lines (also referred to as "dicing lines") 7106 are set at positions overlapping with the separation region 7104. In the dicing step ST72, the semiconductor wafer 7100 is cut along the separation lines 7106, so that chips 7110 including the circuit regions 7102 are cut out from the semiconductor wafer 7100. FIG. 16D is an enlarged view of the chip 7110.

A conductive layer or a semiconductor layer may be provided in the separation region 7104. Providing a conductive layer or a semiconductor layer in the separation region 7104 relieves ESD (Electro Static Discharge) that might be caused in the dicing step, preventing a decrease in a yield due to the dicing step. In addition, a dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation region 7104 allows a reduction in the usage of the pure water. Thus, the cost of producing semiconductor devices can be reduced. Furthermore, the productivity of the semiconductor device can be increased.

After Step ST72, a die bonding step (Step ST73) of individually picking up the divided chips to be mounted on and bonded to a lead frame is performed. As a method for bonding the chip to the lead frame in the die bonding step, a method suitable for a product is selected. The bonding may be performed, for example, with a resin or a tape. In the die bonding step, the chips may be mounted on and bonded to an interposer. In a wire bonding step, a lead of the lead frame and an electrode on the chip are electrically connected with a metal fine line (wire) (Step ST74). A silver line or a gold line can be used as the metal fine line. Wire bonding may be either ball bonding or wedge bonding.

The wire-bonded chip is subjected to a molding step of sealing the chip with an epoxy resin or the like (Step ST75). With the molding step, the inside of the electronic component is filled with resin, so that damage to the circuit portion and the wire embedded by external mechanical force can be reduced, and degradation in characteristics due to moisture or dust can be reduced. The lead of the lead frame is subjected to plating treatment. Then, the lead is cut and processed (Step ST76). This plating treatment prevents corrosion of the lead and enables more reliable soldering at the time of mounting the electronic component on a printed circuit board in a later step. Next, printing treatment (marking) is performed on a surface of the package (Step ST77). Then, through an inspection step (Step ST78), the electronic component is completed (Step ST79).

Figure 16E:
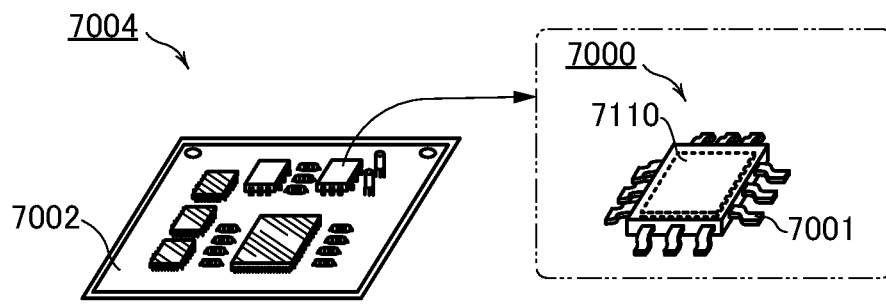

FIG. 16E shows a schematic perspective view of the completed electronic component. FIG. 16E shows a schematic perspective view of a QFP (Quad Flat Package) as an example of the electronic component. As shown in FIG. 16E, an electronic component 7000 includes leads 7001 and a chip 7110.

The electronic component 7000 is mounted on a printed circuit board 7002, for example. A plurality of electronic components 7000 that are combined and electrically connected to each other over the printed circuit board 7002 can be mounted on an electronic device. A completed circuit board 7004 is provided in an electronic device or the like.

The electronic component 7000 can be combined with a component such as a sensor to form a semiconductor device. Examples of a mode to which a sensor is applicable include application to an electronic component that needs to be monitored periodically, such as an electronic device or a battery, and embedding in a structure or a living body.

<Application Example of Semiconductor Device>

Figure 17A:
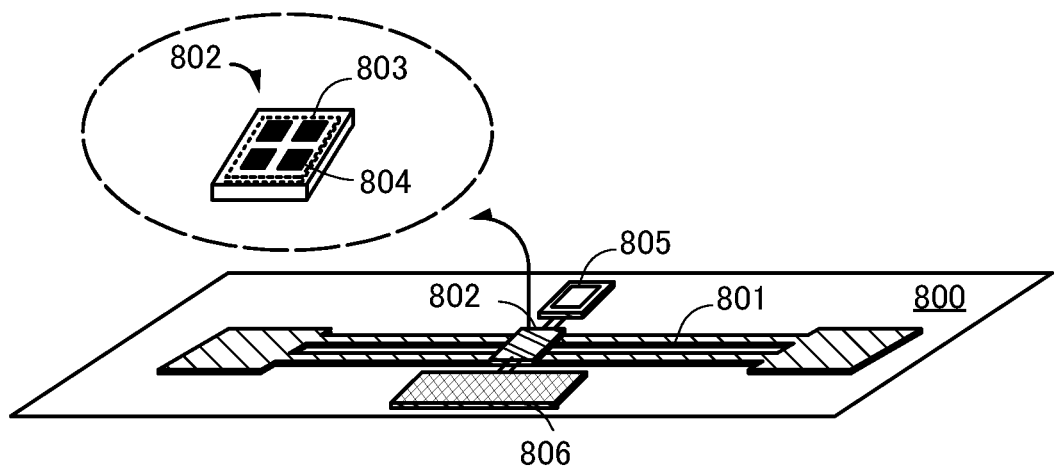
FIG. 17A, FIG. 17B, and FIG. 17C are diagrams showing application examples of a semiconductor device.

FIG. 17A is a perspective view of the semiconductor device described in the above embodiment. As illustrated in FIG. 17A, a semiconductor device 800 includes an antenna 801, an integrated circuit portion 802, a sensor 805, and a battery 806.

The antenna 801 may have any size and shape appropriate for the purpose as long as it is within a range defined by the Radio Law.

The integrated circuit portion 802 includes a circuit 803 formed using a Si transistor and an OS transistor and a terminal portion 804 for connection to the antenna. The circuit 803 is formed through the pre-process for forming the Si transistor and the OS transistor. The terminal portion 804 is formed through the post-process for forming a chip that includes a dicing step and a bonding step. The integrated circuit portion 802 corresponds to the electronic component.

The sensor 805 is a circuit having a function of outputting a variety of information such as thermal or electromagnetic information as analog data.

Figure 17B:
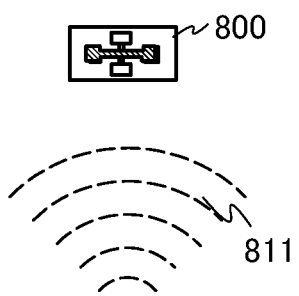
Figure 17C:
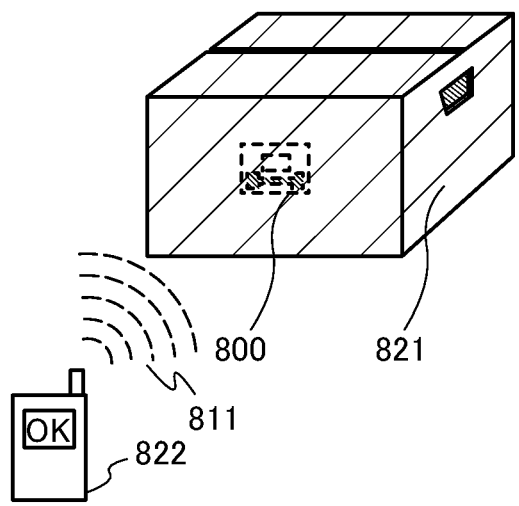

FIG. 17B is a schematic view of the semiconductor device 800 in FIG. 17A that receives a radio signal 811. An application mode of such a semiconductor device can be described with reference to a perspective view illustrated in FIG. 17C. For example, the semiconductor device 800 is attached to or incorporated in an article 821, and the radio signal 811 is transmitted from an external interrogator 822. The semiconductor device 800, which has received the radio signal 811, can sequentially obtain information such as temperature as an analog voltage by the sensor with the use of the power of the battery 806 and can perform A/D conversion and transmission at the timing of receiving the radio signal 811 from the interrogator 822.

Figure 18A:
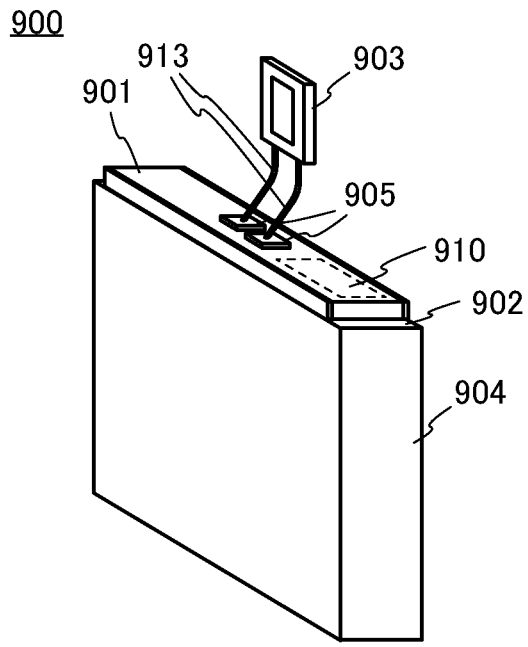
FIG. 18A and FIG. 18B are diagrams showing application examples of a semiconductor device.
Figure 18B:
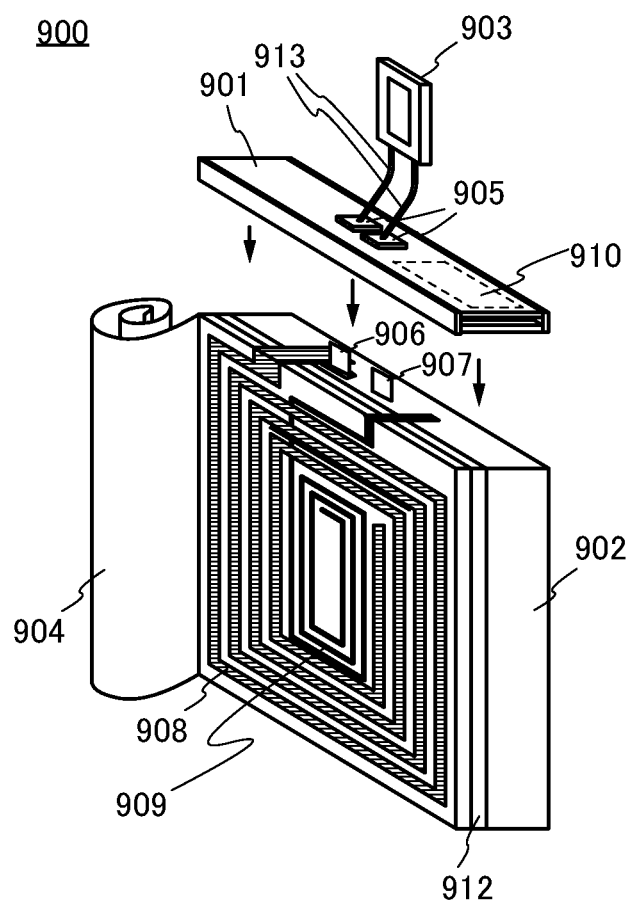

FIG. 18A and FIG. 18B are perspective views for describing another application mode of the semiconductor device 800 of one embodiment of the present invention. A semiconductor device 900 includes a circuit board 901, a battery 902, and a sensor 903. A label 904 is attached to the battery 902. As illustrated in FIG. 18B, the semiconductor device 900 further includes a terminal 906, a terminal 907, an antenna 908, and an antenna 909.

The circuit board 901 includes terminals 905 and an integrated circuit 910. The terminals 905 are connected to the sensor 903 via wires 913. Note that the number of the terminals 905 is not limited to two and is determined in accordance with the need.

Furthermore, a semiconductor element such as a transistor or a diode, a resistor, a wiring, or the like may be formed on the circuit board 901.

Each of the antenna 908 and the antenna 909 is not limited to having a coil shape and may have a linear shape or a plate shape, for example.

The integrated circuit 910 includes a circuit formed using a Si transistor or an OS transistor.

The sensor 903 is a circuit having a function of outputting a variety of information such as thermal, mechanical, or electromagnetic information as analog data.

The semiconductor device 900 includes a layer 912 between the battery 902 and the antenna 908 and the antenna 909. A layer 812 has, for example, a function of blocking an electromagnetic field by the battery 902. As the layer 912, a magnetic body can be used, for example.

Figure 19A:
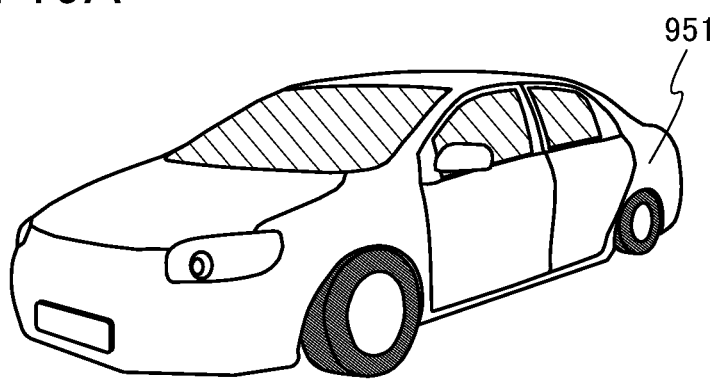
FIG. 19A and FIG. 19B are diagrams showing application examples of a semiconductor device.
Figure 19B:
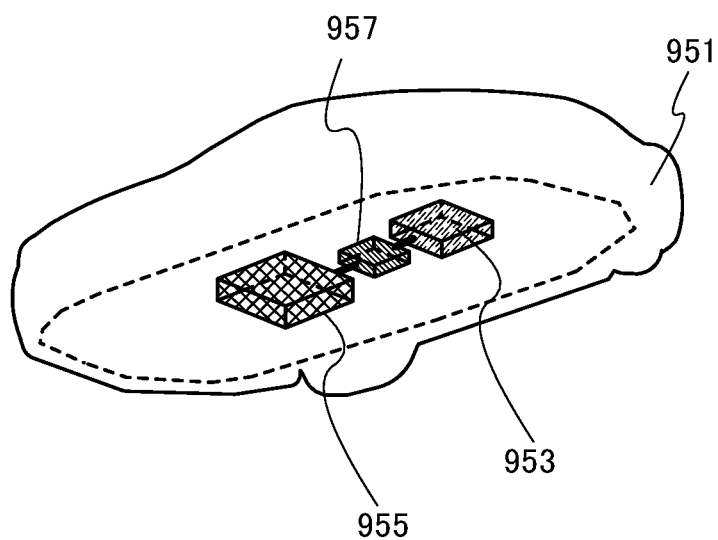

An application example of the semiconductor device 900 to another device can be described with reference to schematic views illustrated in FIG. 19A and FIG. 19B. FIG. 19A is a perspective view of a motor vehicle 951. FIG. 19B is a transparent view of the motor vehicle 951 illustrated in FIG. 19A. The motor vehicle 951 is driven when a control signal is supplied to a power unit 953. The motor vehicle 951 includes a battery 955 that supplies power for supplying a control signal to the power unit 953, and a control unit 957.

For example, the semiconductor device 900 is installed in the battery 955 inside the motor vehicle 951. When a user gets in the motor vehicle 951, the control unit 957 is started up, and analog data on anomaly detection of the battery 955 is collected in the control unit 957. The semiconductor device 900 can acquire information such as temperature around the battery 955 without starting up an A/D converter and the like. As described above, power consumption for driving an A/D converter circuit can be reduced, and thus the consumption of the battery at the time of stopping can be reduced.

Figure 20A:
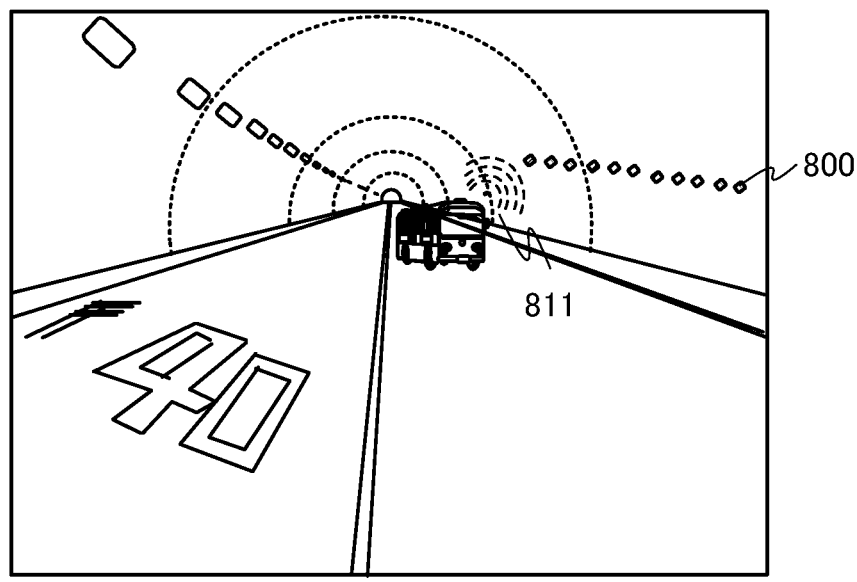
FIG. 20A and FIG. 20B are diagrams showing application examples of a semiconductor device.

Another application mode of the semiconductor device can be described with reference to a schematic diagram illustrated in FIG. 20A. For example, the semiconductor device 800 is embedded in a tunnel wall surface, and a radio signal 911 is transmitted from the outside. The semiconductor device 800 that has received the radio signal 911 can acquire information on the tunnel wall surface by the sensor and transmit the information. The use of the semiconductor device described in Embodiment 1 for the semiconductor device 800 enables efficient investigation of the disrepair of the tunnel wall surface.

Figure 20B:
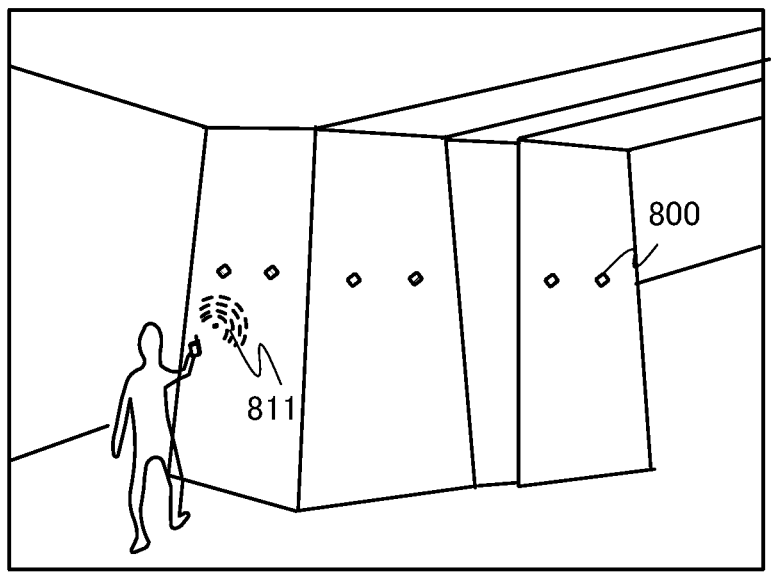

Another application mode of the wireless sensor can be described with reference to a schematic diagram illustrated in FIG. 20B. For example, the semiconductor device 800 is embedded in a wall surface of a bridge pillar, and the radio signal 911 is transmitted from the outside. The semiconductor device 800 that has received the radio signal 911 can acquire information in the bridge pillar by the sensor and transmit the information. The use of the semiconductor device described in Embodiment 1 for the semiconductor device 800 enables efficient investigation of the disrepair in the bridge pillar.

Figure 21A:
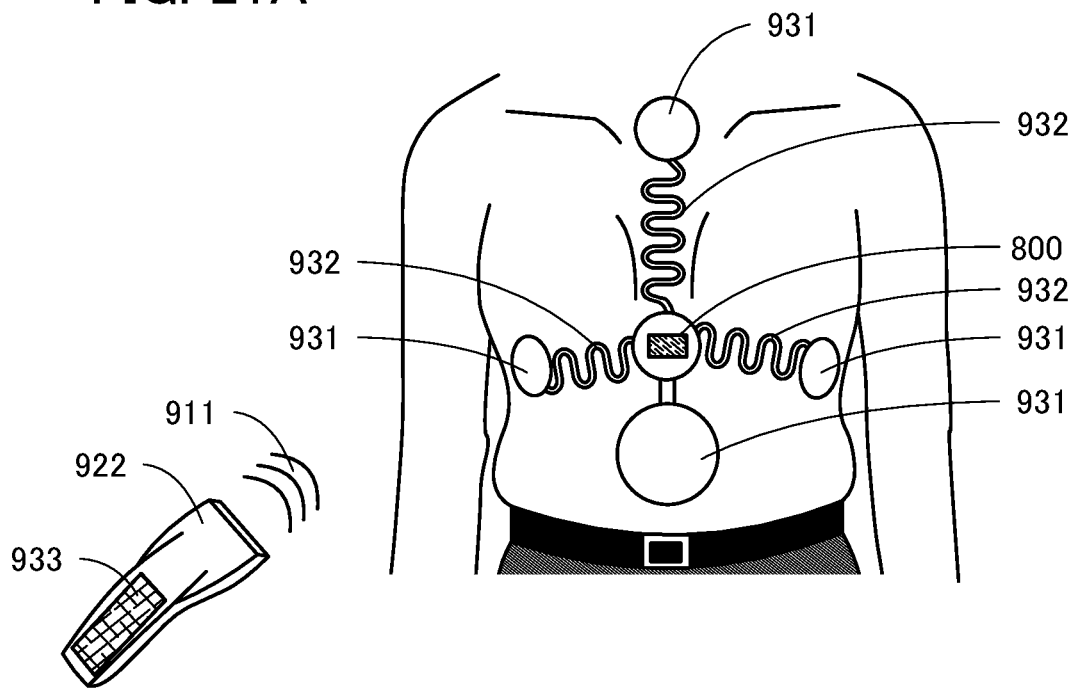
FIG. 21A and FIG. 21B are diagrams showing application examples of a semiconductor device.

Another application mode of the wireless sensor can be described with a schematic diagram illustrated in FIG. 21A. For example, the semiconductor device 800 is attached to a human body with the use of a bond pad or the like, and the radio signal 911 is transmitted from a reader 922. The semiconductor device 800 that has received the radio signal 911 can acquire information such as biological information by supplying a signal through a wiring 932 to an electrode 931 or the like attached to the human body, and transmit the information. The acquired information can be checked on a display portion 933 of the reader 922. The use of the semiconductor device described in Embodiment 1 for the semiconductor device 800 enables efficient acquisition of biological information of human bodies.

Figure 21B:
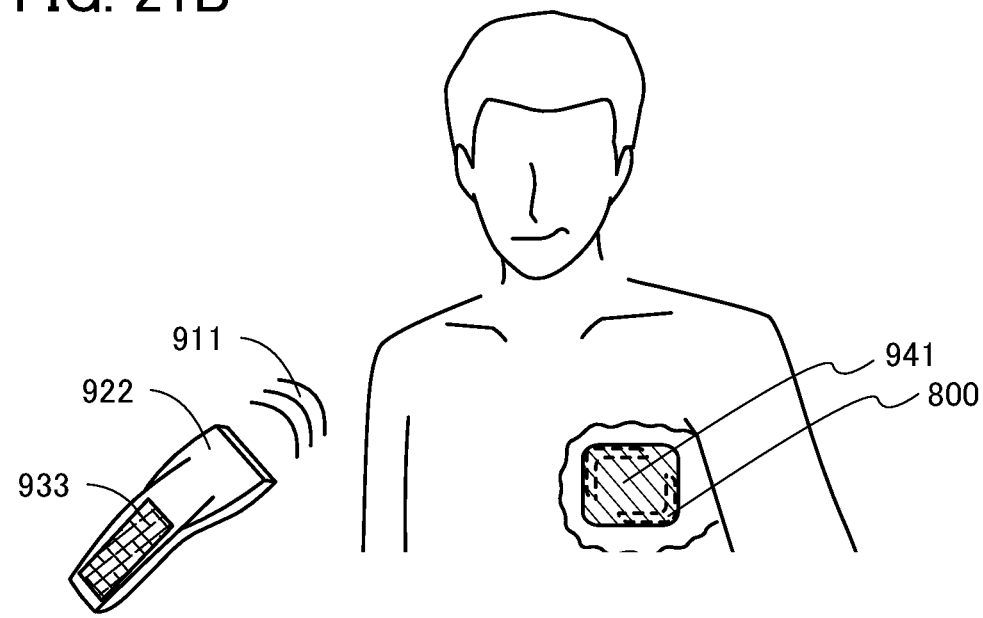

Another application mode of the wireless sensor can be described with a schematic diagram illustrated in FIG. 21B. For example, the semiconductor device 800 that is contained in a housing 941 is implanted in a human body, and the radio signal 911 is transmitted from the reader 922 outside the body. The semiconductor device 800 that has received the radio signal 911 can acquire information such as biological information and transmit the information. The acquired information can be checked on the display portion 933 of the reader 922. The use of the semiconductor device described in Embodiment 1 for the semiconductor device 800 enables efficient acquisition of biological information of human bodies.

(Supplementary Notes on the Description in this Specification and the Like)

The description of the above embodiments and each structure in the embodiments are noted below.

One embodiment of the present invention can be constituted by combining, as appropriate, the structure described in each embodiment with the structures described in the other embodiments. In addition, in the case where a plurality of structure examples are described in one embodiment, the structure examples can be combined as appropriate.

Note that content (or may be part of the content) described in one embodiment can be applied to, combined with, or replaced with another content (or may be part of the content) described in the embodiment and/or content (or may be part of the content) described in another embodiment or other embodiments.

Note that in each embodiment, content described in the embodiment is content described using a variety of diagrams or content described with text disclosed in the specification.

Note that by combining a diagram (or may be part thereof) described in one embodiment with another part of the diagram, a different diagram (or may be part thereof) described in the embodiment, and/or a diagram (or may be part thereof) described in another embodiment or other embodiments, much more diagrams can be formed.

In addition, in this specification and the like, components are classified on the basis of the functions, and shown as blocks independent of one another in block diagrams. However, in an actual circuit or the like, it is difficult to separate components on the basis of the functions, and there are such a case where one circuit is associated with a plurality of functions and a case where a plurality of circuits are associated with one function. Therefore, blocks in the block diagrams are not limited by the components described in this specification, and the description can be changed appropriately depending on the situation.

Furthermore, in the drawings, the size, the layer thickness, or the region is shown with given magnitude for description convenience. Therefore, the size, the layer thickness, or the region is not necessarily limited to the illustrated scale. Note that the drawings are schematically shown for clarity, and embodiments of the present invention are not limited to shapes, values or the like shown in the drawings. For example, variation in signal, voltage, or current due to noise, variation in signal, voltage, or current due to difference in timing, or the like can be included.

In this specification and the like, expressions "one of a source and a drain" (or a first electrode or a first terminal) and "the other of the source and the drain" (or a second electrode or a second terminal) are used in the description of the connection relationship of a transistor. This is because the source and the drain of the transistor change depending on the structure, operating conditions, or the like of the transistor. Note that the source or the drain of the transistor can also be referred to as a source (drain) terminal, a source (drain) electrode, or the like as appropriate depending on the situation.

In addition, in this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

Furthermore, in this specification and the like, "voltage" and "potential" can be interchanged with each other as appropriate. The voltage refers to a potential difference from a reference potential, and when the reference potential is a ground voltage, for example, the voltage can be rephrased into the potential. The ground potential does not necessarily mean 0 V. Note that potentials are relative values, and a potential applied to a wiring or the like is sometimes changed depending on the reference potential.

Note that in this specification and the like, the terms such as "film" and "layer" can be interchanged with each other depending on the case or according to circumstances. For example, the term "conductive layer" can be changed into the term "conductive film" in some cases. As another example, the term "insulating film" can be changed into the term "insulating layer" in some cases.

In this specification and the like, a switch has a function of controlling whether a current flows or not by being in a conduction state (an on state) or a non-conduction state (an off state). Alternatively, a switch has a function of selecting and changing a current path.

In this specification and the like, channel length refers to, for example, the distance between a source and a drain in a region where a semiconductor (or a portion where a current flows in a semiconductor when a transistor is in an on state) and a gate overlap with each other or a region where a channel is formed in a top view of the transistor.

In this specification and the like, channel width refers to, for example, the length of a portion where a source and a drain face each other in a region where a semiconductor (or a portion where a current flows in a semiconductor when a transistor is in an on state) and a gate electrode overlap with each other or a region where a channel is formed.

In this specification and the like, the expression "A and B are connected" includes the case where A and B are electrically connected as well as the case where A and B are directly connected. Here, the expression "A and B are electrically connected" includes the case where electric signals can be transmitted and received between A and B when an object having any electric action exists between A and B.

REFERENCE NUMERALS

FN N: node, FN_1: node, FN_2: node, FN_3: node, SR_1: signal, ST72: dicing step, SW_1: signal, SW_2: signal, SW_3: signal, SW_4: signal, T0: time, T1: time, T2: time, T3: time, T4: time, TN: time, 11: sensor, 12: amplifier circuit, 13: sample-and-hold circuit, 13_N: sample-and-hold circuit, 13_1: sample-and-hold circuit, 13_2: sample-and-hold circuit, 13A: sample-and-hold circuit, 13B: sample-and-hold circuit, 13C: sample-and-hold circuit, 13D: sample-and-hold circuit, 14: A/D converter circuit, 15: interface circuit, 21: transistor, 21_N: transistor, 21_1: transistor, 21A: transistor, 21B: transistor, 22: transistor, 22_N: transistor, 22_1: transistor, 22C: transistor, 23: transistor, 23A: transistor, 23B: transistor, 24_N: transistor, 24_1: transistor, 27: switch, 28: capacitor, 29: comparator, 31_N: signal holding circuit, 31_1: signal holding circuit, 41: selection circuit, 42: signal holding circuit, 43: selection circuit, 44: selection circuit, 45: adder circuit, 51_N: transistor, 51_1: transistor, 52_N: capacitor, 52_1: capacitor, 52_2: capacitor, 52_3: capacitor, 52_4: capacitor, 53: transistor, 54: transistor, 55: transistor, 56: transistor, 61: period, 62: period, 100: semiconductor device, 100_n: semiconductor device, 100_1: semiconductor device, 100_2: semiconductor device, 100A: semiconductor device, 100B: semiconductor device, 110: host controller, 110_1: host controller, 110_2: host controller, 200: control block, 201: main CPU, 202: peripheral circuit, 203: communication circuit block, 299: cloud, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 505: conductor, 510: insulator, 512: insulator, 514: insulator, 516: insulator, 518: conductor, 520: insulator, 522: insulator, 524: insulator, 526: insulator, 530: oxide, 530a: oxide, 530b: oxide, 530c: oxide, 540a: conductor, 540b: conductor, 542: conductor, 542a: conductor, 542b: conductor, 543a: region, 543b: region, 544: insulator, 546: conductor, 548: conductor, 550: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 800: semiconductor device, 801: antenna, 802: integrated circuit portion, 803: circuit, 804: terminal portion, 805: sensor, 806: battery, 811: radio signal, 812: layer, 821: article, 822: interrogator, 900: semiconductor device, 901: circuit board, 902: battery, 903: sensor, 904: label, 905: terminal, 906: terminal, 907: terminal, 908: antenna, 909: antenna, 910: integrated circuit, 911: radio signal, 912: layer, 913: wire, 922: reader, 931: electrode, 932: wiring, 933: display portion, 941: housing, 951: motor vehicle, 953: power unit, 955: battery, 957: control unit, 7000: electronic component, 7001: lead, 7002: printed circuit board, 7004: circuit board, 7100: semiconductor wafer, 7102: circuit region, 7104: separation region, 7106: separation line, and 7110: chip.

The invention claimed is:

1. A semiconductor device comprising:
a sensor configured to output a sensor signal;
an amplifier circuit configured to amplify the sensor signal;
a sample-and-hold circuit comprising a plurality of signal holding circuits and an adder circuit; and
an analog-to-digital converter circuit electrically connected to the adder circuit,
wherein each of the plurality of signal holding circuits is configured to retain an output signal of the amplifier circuit,
wherein each of the plurality of signal holding circuits comprises a capacitor and a first transistor comprising an oxide semiconductor in a channel formation region,
wherein the adder circuit is configured to add the output signals of the amplifier circuit which are retained by the plurality of signal holding circuits,
wherein the sample-and-hold circuit comprises a second transistor and a third transistor,
wherein a gate of the second transistor is electrically connected to the other electrode of the capacitor, and
wherein one of a source and a drain of the second transistor and one of a source and a drain of the third transistor are electrically connected to the analog-to-digital converter circuit.

2. The semiconductor device according to claim 1,
wherein the adder circuit comprises a plurality of capacitors, and
wherein one electrodes of the plurality of capacitors are electrically connected to each other.

3. The semiconductor device according to claim 1, further comprising an interface circuit configured to switch a first control period and a second control period,
wherein in the first control period, the sensor signal is input to the amplifier circuit and the output signal of the amplifier circuit is retained in the sample-and-hold circuit, wherein in the second control period, a digital signal from the analog-to-digital converter circuit is output to the interface circuit, and wherein the first control period is longer than the second control period.

4. The semiconductor device according to claim 1, wherein one of a source and a drain of the first transistor is electrically connected to the amplifier circuit, wherein the other of the source and the drain of the first transistor is electrically connected to one electrode of the capacitor.

5. The semiconductor device according to claim 1, wherein the first transistor comprises a back gate electrode.

6. A semiconductor device comprising:

a sensor configured to output a sensor signal;

an amplifier circuit configured to amplify the sensor signal;

a sample-and-hold circuit comprising a plurality of signal holding circuits and an adder circuit; and an analog-to-digital converter circuit electrically connected to the adder circuit, wherein each of the plurality of signal holding circuits is configured to retain an output signal of the amplifier circuit, wherein each of the plurality of signal holding circuits comprises a capacitor and a first transistor comprising an oxide semiconductor in a channel formation region, wherein the adder circuit is configured to add the output signals of the amplifier circuit which are retained by the plurality of signal holding circuits, wherein the sample-and-hold circuit comprises a second transistor and a third transistor, and wherein the second transistor and the third transistor function as a source-follower circuit.

7. The semiconductor device according to claim 6, wherein the adder circuit comprises a plurality of capacitors, and wherein one electrodes of the plurality of capacitors are electrically connected to each other.

8. The semiconductor device according to claim 6, further comprising an interface circuit configured to switch a first control period and a second control period, wherein in the first control period, the sensor signal is input to the amplifier circuit and the output signal of the amplifier circuit is retained in the sample-and-hold circuit, wherein in the second control period, a digital signal from the analog-to-digital converter circuit is output to the interface circuit, and wherein the first control period is longer than the second control period.

9. The semiconductor device according to claim 6, wherein one of a source and a drain of the first transistor is electrically connected to the amplifier circuit, wherein the other of the source and the drain of the first transistor is electrically connected to one electrode of the capacitor.

10. The semiconductor device according to claim 6, wherein the first transistor comprises a back gate electrode.

* * * * *